(12) United States Patent
Liao et al.

(10) Patent No.: US 12,243,589 B2
(45) Date of Patent: Mar. 4, 2025

(54) MEMORY DEVICE AND METHOD FOR OPERATING THE SAME

(71) Applicant: TAIWAN SEMICONDUCTOR MANUFACTURING COMPANY, LTD., Hsinchu (TW)

(72) Inventors: Pei-Chun Liao, Hsinchu County (TW); Yu-Kai Chang, Hsinchu (TW); Yi-Ching Liu, Hsinchu (TW); Yu-Ming Lin, Hsinchu (TW); Yih Wang, Hsinchu (TW); Chieh Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 150 days.

(21) Appl. No.: 17/898,733

(22) Filed: Aug. 30, 2022

(65) Prior Publication Data
US 2024/0071504 A1    Feb. 29, 2024

(51) Int. Cl.
*G11C 16/26* (2006.01)
*G11C 16/08* (2006.01)
*G11C 16/32* (2006.01)

(52) U.S. Cl.
CPC .............. *G11C 16/08* (2013.01); *G11C 16/26* (2013.01); *G11C 16/32* (2013.01)

(58) Field of Classification Search
CPC .......... G11C 16/08; G11C 16/26; G11C 16/32
See application file for complete search history.

(56) References Cited

U.S. PATENT DOCUMENTS

| | | | | |
|---|---|---|---|---|
| 7,245,537 B2* | 7/2007 | Jeong | ............... | G11C 16/102 365/185.18 |
| 9,697,913 B1* | 7/2017 | Mariani | ............... | G11C 11/2273 |
| 2003/0099127 A1* | 5/2003 | Yang | ............... | G11C 11/22 365/149 |
| 2011/0051507 A1* | 3/2011 | Sarkar | ............... | G11C 13/0033 711/E12.001 |
| 2023/0153202 A1* | 5/2023 | Song | ............... | G06F 11/1068 714/764 |
| 2023/0359260 A1* | 11/2023 | Gamage | ............... | G06F 11/1441 |
| 2023/0395114 A1* | 12/2023 | Visconti | ............... | G11C 11/2297 |

OTHER PUBLICATIONS

Liao et al., "Characterization of Fatigue and Its Recovery Behavior in Ferroelectric HfZrO," 2021 Symposium on VLSI Technology Digest of Technical Papers, 2021, pp. 1-2.

* cited by examiner

*Primary Examiner* — Min Huang
(74) *Attorney, Agent, or Firm* — Birch, Stewart, Kolasch & Birch, LLP

(57) ABSTRACT

A memory device is provided, including a memory array, a driver circuit, and recover circuit. The memory array includes multiple memory cells. Each memory cell is coupled to a control line, a data line, and a source line and, during a normal operation, is configured to receive first and second voltage signals. The driver circuit is configured to output at least one of the first voltage signal or the second voltage signal to the memory cells. The recover circuit is configured to output, during a recover operation, a third voltage signal, through the driver circuit to at least one of the memory cells. The third voltage signal is configured to have a first voltage level that is higher than a highest level of the first voltage signal or the second voltage signal, or lower than a lowest level of the first voltage signal or the second voltage signal.

20 Claims, 17 Drawing Sheets

MEMORY DEVICE AND METHOD FOR OPERATING THE SAME

BACKGROUND

After being performed in a certain number of program/erase cycles, the memory units or cells in a memory device may have performance degradation, such as threshold voltage ($V_t$) shift, drain saturation current ($I_{dsat}$) degradation, transconductance ($G_m$) degradation, program/erase state window narrowing, and so on. The root cause is that the strong electric field applied across the gate and source/drain terminals of transistors of memory cells sometimes induces unpredictable charge trap. The issue of how to remove the charge trap successfully remains unsolved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
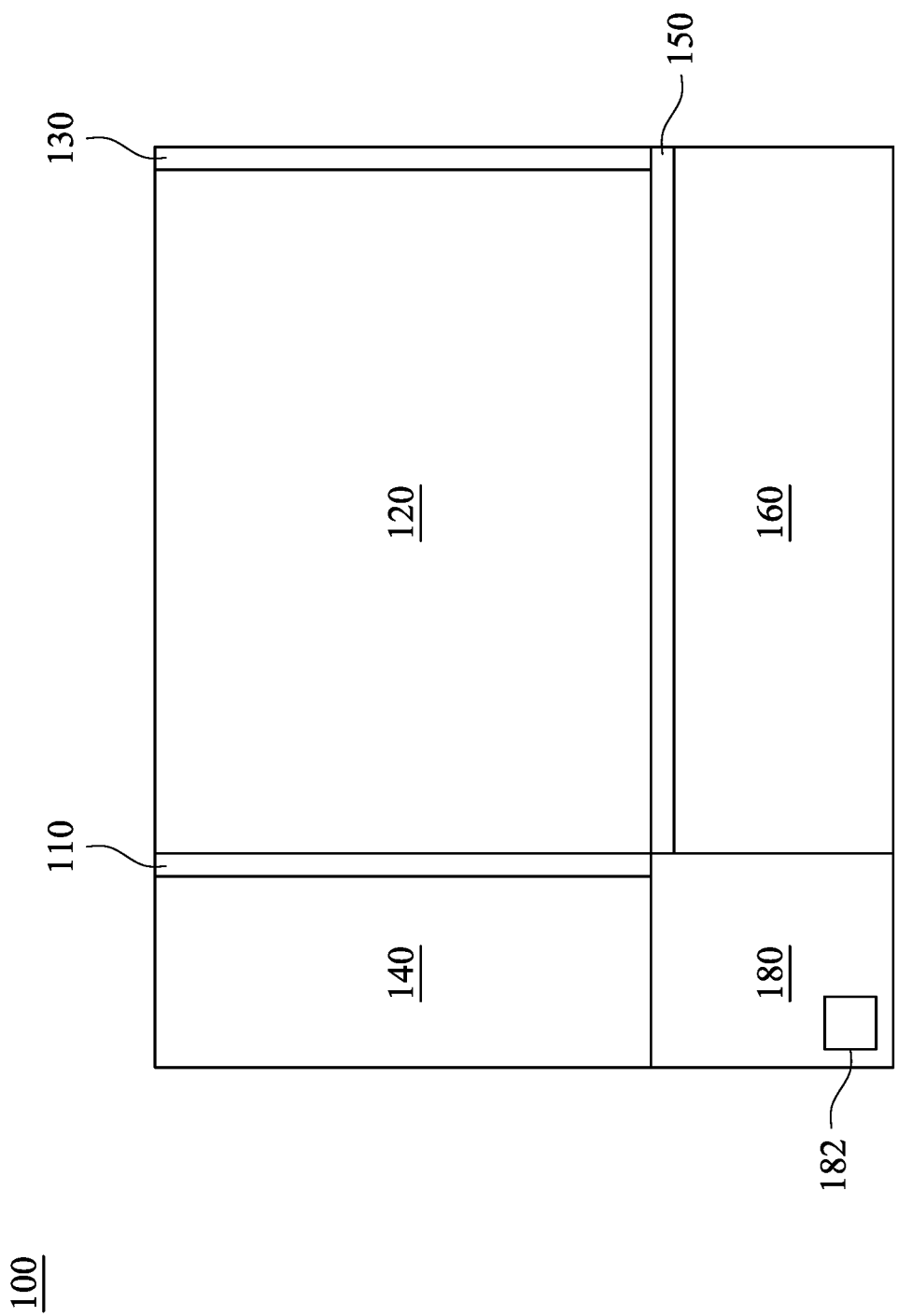
FIG. 1 is a schematic diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory device 100, in accordance with some embodiments of the present disclosure. The memory device 100 includes a memory array 120, a driver circuit 140, a sense amplifier circuit 160, and a recover circuit 180.

Figure 2:
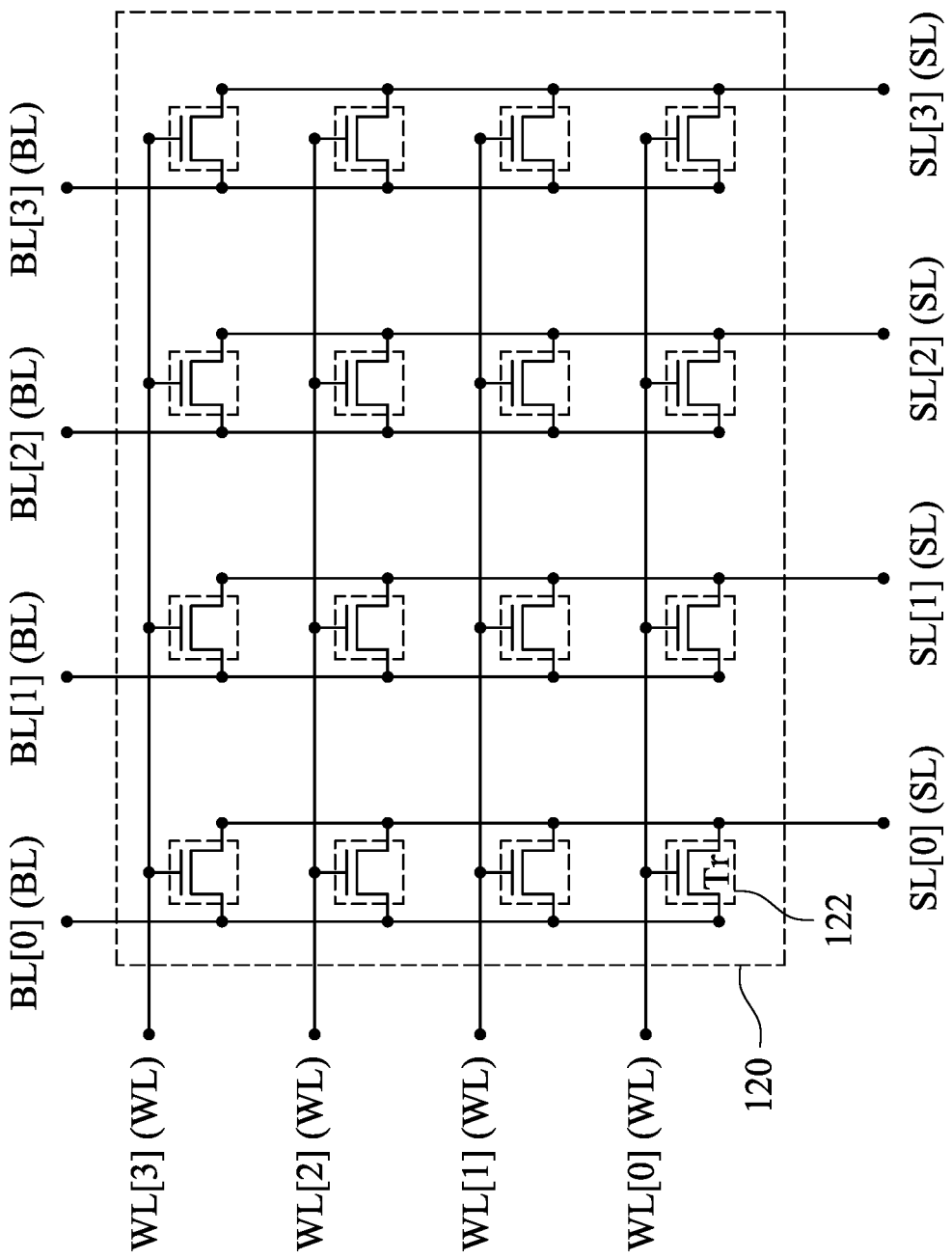
FIG. 2 is a schematic diagram of a memory array included in the memory device shown in FIG. 1, in accordance with some embodiments of the present disclosure.

The memory array 120 includes multiple memory cells arranged in columns and rows, such as the memory cells 122 shown in FIG. 2. In some embodiments, each of the memory cells in the memory array 120 is coupled to the driver circuit 140 and the sense amplifier circuit 160.

In some embodiments, the driver circuit 140 is coupled to the memory cells in the memory array 120 and is configured to control the memory cells. For example, the driver circuit 140 is coupled to a gate of a transistor included in each memory cell through a control line in order to control the memory cell to be turned on or off during various operations of the memory device 100. In some embodiments, the driver circuit 140 is coupled to the memory cells through word lines, and the driver circuit 140 is referred to as a word line driver circuit or includes a word line driver circuit. In some embodiments, the control line as discussed above is referred to as a word line.

In some embodiments, the sense amplifier circuit 160 is coupled to the memory cells in the memory array 120 and is configured to identify or read the data stored in the memory cells. For example, the sense amplifier circuit 160 is coupled to source/drain terminals of a transistor included in each memory cell through a data line and a source line, and is configured to detect the current passing through one of the memory cells in order to determine the value stored in the memory cell, such as a logic high or logic low value. In some embodiments, the sense amplifier circuit 160 includes a driver circuit (not shown) configured to output voltage signals to the data lines and source lines. In some embodiments, the sense amplifier circuit 160 is referred to as a driver circuit as well. In some embodiments, the data line as discussed above is referred to as a bit line.

In some embodiments, during a normal operation including, for example, a write operation or a programming operation, each memory cell arranged in the memory array 120 is configured to receive a first voltage signal from the driver circuit 140 through the control line and to receive a second voltage signal from the sense amplifier circuit 160 through the data line and the source line.

In some embodiments, the recover circuit 180 is coupled to the driver circuit 140 and/or the sense amplifier circuit 160 and is configured to output, during a recover operation, voltage signals through the driver circuit 140 and/or the sense amplifier circuit 160 to at least one of the memory cells arranged in the memory array 120. In some embodiments, the voltage signals output by the recover circuit 180 have voltage levels different from the voltage levels of the voltage signals that the driver circuit 140 and/or the sense amplifier circuit 160 output to the memory cells.

In some embodiments, the recover circuit 180 further includes a timer circuit 182 configured to count a number of performed operation and enable the memory device 100 to perform a different operation when the number reaches a certain value. For example, the timer circuit 182 counts a number of write operations of the memory device 100, and when the number reaches a certain value or exceeds a threshold value, the timer circuit 182 enables the memory device 100 to perform a recover operation which will be discussed below.

In some embodiments, the memory device 100 further includes a reference memory cell column 130. The reference memory cell column 130 includes at least one column of memory cells. For illustration, when the memory device 100 performs write/program, read, and/or other operations, and voltage signals are transmitted to the memory cells in the memory array 120, the memory cells included in the reference memory cell column 130 are not subject to such voltage signals. Alternatively stated, the memory cells included in the reference memory cell column 130 do not go through many operations and thus are referred to as fresh memory cells in some embodiments, relative to the memory cells in the memory array 120 that have gone through much more operations. In some embodiments, the reference memory cell column 130 is configured to provide a reference current for comparison with the currents from the memory array 120.

In some embodiments, the memory device 100 further includes a detecting circuit 150 arranged between the memory array 120 and the sense amplifier circuit 160. The detecting circuit 150 is configured to detect a current change associated with at least one of the data line or the source line as discussed above. When the current change exceeds a threshold value, the detecting circuit 150 is configured to enable the recover circuit 180 to perform the recover operation.

In some embodiments, the memory device 100 further includes an enabling circuit 110 arranged between the memory array 120 and the driver circuit 140. The enabling circuit 110 is configured to enable the recover circuit 180 periodically to perform the recover operation, and the enabling circuit 110 is also configured to enable the recover circuit 180 when a current change associated with at least one of the data line or the source line exceeds a threshold value.

The arrangements of the timer circuit 182, the detecting circuit 150, and the enabling circuit 110 in the memory device 100, as discussed above, are given for illustrative purposes. Various arrangements are within the contemplated scope of the present disclosure. For example, in various embodiments, the memory device 100 includes the enabling circuit 110, without the timer circuit 182 and the detecting circuit 150. In various embodiments, the memory device 100 includes one of the timer circuit 182 and the detecting circuit 150, without the enabling circuit 110 and the other one of the timer circuit 182 and the detecting circuit 150.

FIG. 2 is a schematic diagram of the memory array 120 included in the memory device 100 shown in FIG. 1, in accordance with some embodiments of the present disclosure. The memory array 120 includes multiple memory cells 122 arranged in columns and rows. Each memory cell 122 is coupled to a word line WL, a bit line BL, and a source line SL. For illustration of FIG. 2, the memory cells 122 are coupled to the word lines WL[0]-WL[3], the bit lines BL[0]-BL[3], and the source lines SL[0]-SL[3], respectively. In the present disclosure, the word lines WL[0]-WL[3] are collectively referred to as the word line WL, the bit lines BL[0]-BL[3] are collectively referred to as the bit line BL, and the source lines SL[0]-SL[3] are collectively referred to as the source line SL.

For simplicity of illustration, FIG. 2 merely illustrates four word lines WL, four bit lines BL, four source lines SL, and a corresponding number of memory cells 122. The numbers of the word lines WL, the bit lines BL, the source lines SL, and the memory cells 122 are given for illustrative purposes. Various numbers of the word lines WL, the bit lines BL, the source lines SL, and the memory cells 122 are within the contemplated scope of the present disclosure.

In some embodiments, each memory cell 122 includes a transistor Tr, as illustrated in FIG. 2. For illustration of FIG. 2, the gate of the transistor Tr in each memory cell 122 is coupled to a word line WL, one source/drain terminal of the transistor Tr in each memory cell 122 is coupled to a bit line BL, and the other source/drain terminal of the transistor Tr in each memory cell 122 is coupled to a source line SL.

In some embodiments, with reference to FIG. 1 and FIG. 2, the word lines WL are coupled to the driver circuit 140 in FIG. 1, and the driver circuit 140 is configured to output voltage signals to the memory cells 122 through the word lines WL. In such embodiments, the bit lines BL and the source lines SL are coupled to another driver circuit or the sense amplifier circuit 160 shown in FIG. 1, and the sense amplifier circuit 160 is configured to output voltage signals to the memory cells 122 through the bit lines BL and the source lines SL.

Figure 3:
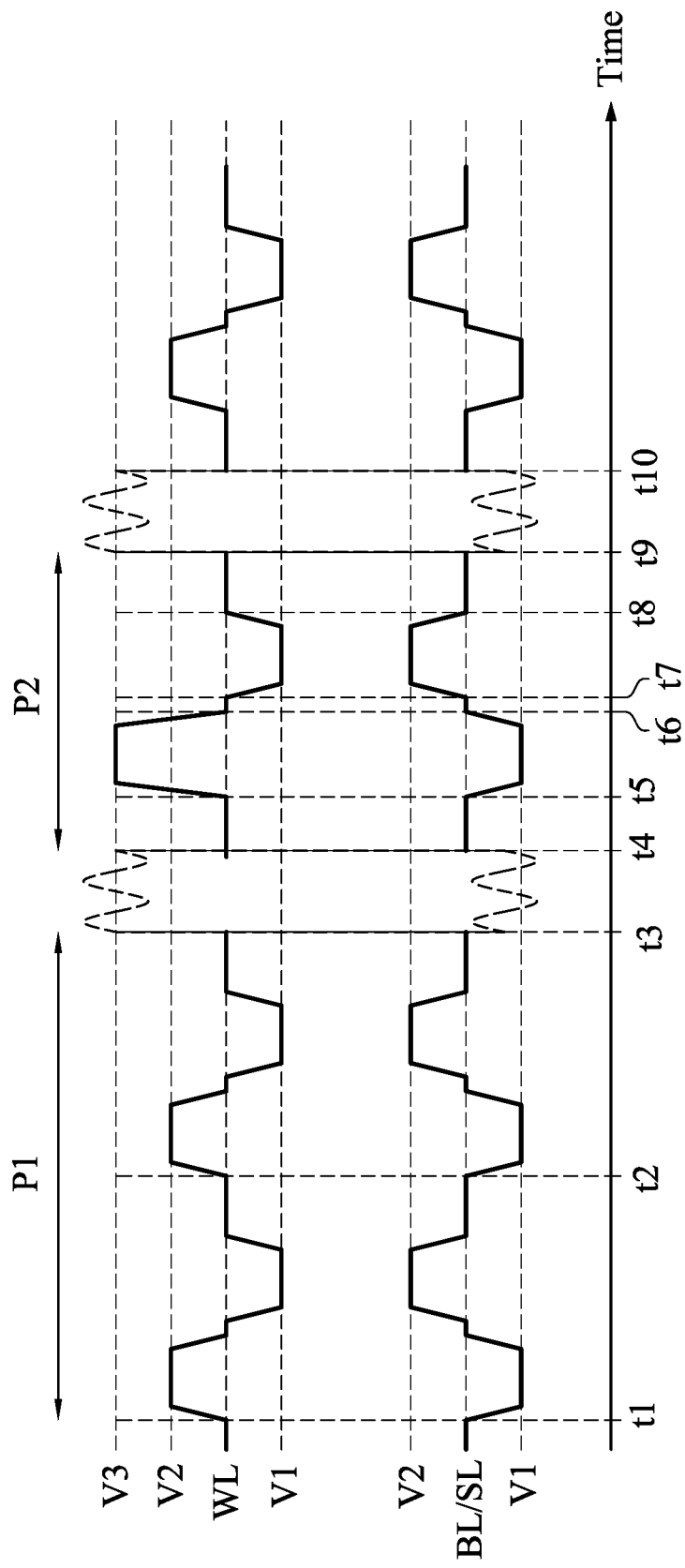
FIG. 3 is a waveform diagram of word line, bit line, and source line signals received by one or more of the memory cells shown in FIG. 2, in accordance with some embodiments of the present disclosure.

FIG. 3 is a waveform diagram of word line, bit line, and source line signals received by one or more of the memory cells 122 shown in FIG. 2, in accordance with some embodiments of the present disclosure. The word line signal is denoted as "WL" in FIG. 3, and the bit line and source line signals are denoted as "BL/SL" in FIG. 3. In some embodiments, the bit line and source line signals received by one or more of the memory cells 122 shown in FIG. 2 are the same, and the waveforms of the two signals are represented as a single waveform denoted as "BL/SL" in FIG. 3.

For illustration of FIG. 3, during a period P1, the highest voltage level of the word line signal is V2, and the lowest voltage level of the word line signal is V1. In some embodiments, as shown in FIG. 3, during the period P1, the highest voltage level of the bit line and source line signals are V2, and the lowest voltage level of the bit line and source line signals are V1. In some embodiments, V2 is positive, and V1 is negative. In some embodiments, the absolute value of V1 equals V2.

For illustration, during time t1-t2, the change of the voltage level of the word line signal is:

$0V(\text{at time } t1) \to V2 \to 0V \to V1 \to 0V(\text{at time } t2)$

For illustration, during time t1-t2, the change of the voltage level of the bit line and source line signals are:

$0V(\text{at time } t1) \to V1 \to 0V \to V2 \to 0V(\text{at time } t2)$

Alternatively stated, both the word line signal and the bit line and source line signals oscillate between V2 and V1 during time t1-t2 (and also during time t2-t3), while the voltage levels of the word line signal and the bit line and source line signals are opposite to each other.

In some embodiments, with reference to FIG. 2 and FIG. 3, the period P1 corresponds to the write or programming operation of the memory cells 122. During the period P1, when the word line signal has a voltage level of V2 and the bit line and source line signals have voltage levels of V1, the memory cell 122 receiving those signals through its gate and source/drain terminals respectively is configured to store a first logic value. Alternatively stated, when a voltage difference of (|V2|+|V1|) exists across the gate terminal and the source/drain terminals of the memory cell 122 and the word line signal has a higher voltage level than the bit line and source line signals, the memory cell 122 corresponds to a first state and is configured to store a first logic value. For example, the first logic value is a logic high or logic 1 value.

In some embodiments, during the period P1, when the word line signal has a voltage level of V1 and the bit line and source line signals have voltage levels of V2, the memory cell 122 receiving those signals through its gate and source/drain terminals respectively is configured to store a second logic value. Alternatively stated, when a voltage difference of (|V2|+|V1|) exists across the gate terminal and the source/drain terminals of the memory cell 122 and the word line signal has a lower voltage level than the bit line and source line signals, the memory cell 122 corresponds to a second state and is configured to store a second logic value. For example, the second logic value is a logic low or logic 0 value.

For illustration of FIG. 3, during the period P1, the memory cell 122 goes through multiple write operations. The waveforms of the word line and the bit line and source line signals during time t3-t4 are omitted. In some embodiments, the memory cell 122 also goes through multiple write operations during time t3-t4, and the waveforms of the word line and the bit line and source line signals during time t3-t4 are similar to the ones during time t1-t2.

For illustration of FIG. 3, during a period P2, the highest voltage level of the word line signal is V3, which is higher than V2, and the lowest voltage level of the word line signal is V1, while the bit line and source line voltage signals have the same waveform throughout the periods P1 and P2.

For illustration, during time t4-t9, the change of the voltage level of the word line signal is:

$0V \to V3(\text{during time } t5\text{-}t6) \to 0V \to V1 \to 0V$

In some embodiments, with reference to FIG. 2 and FIG. 3, the period P2 corresponds to a recover operation of the memory cell 122. In the recover operation, a voltage difference of (|V3|+|V1|) is applied across the gate and source/drain terminals of a selected memory cell 122. Such voltage difference is larger than the voltage difference of (|V2|+|V1|) applied across the gate and source/drain terminals of the memory cell 122 during the period P1, and is configured to recover the memory cell 122 from performance degradation resulting from continual or frequent normal operations.

For illustration of FIG. 3, after the period P2, the memory cell 122 operates in the normal operation, and thus the waveforms of the signals during the period P1 and after time t10 are similar.

In some examples, in order to write or rewrite data or values into the memory cell 122, the voltage difference (|V2|+|V1|) is applied across the gate and source/drain terminals of the transistor of the memory cell 122 repeatedly during write operations. Note that the voltage difference is constant and equal to (|V2|+|V1|), no matter the value that is written into the memory cell 122.

In such examples, after being performed a certain number of program/erase cycles, the memory cells 122 will have performance degradation, such as threshold voltage ($V_t$) shift, drain saturation current ($I_{dsat}$) degradation, transconductance ($G_m$) degradation, program/erase state window narrowing, and so on. Such performance degradation results from the electric field generated by the constant voltage difference applied across the gates and source/drain terminals of the transistors of the memory cells 122 and the unpredictable charge trap, where charges or electrons are trapped at certain portion of the transistor of the memory cell 122, induced by the electric field.

In some embodiments, in the recover operation (corresponding to the period P2 in FIG. 3), the voltage difference (|V3|+|V1|), which is larger than the voltage difference (|V2|+|V1|) in the period P1, is applied across the gate and source/drain terminals of the transistor of the memory cell 122, to de-trap the trapped charge discussed above through a stronger electric field and thus recover, cure, or repair the memory cell 122 and remove its performance degradation and/or aging effect.

In some embodiment, with reference to FIG. 1, FIG. 2, and FIG. 3, during the period P1, the driver circuit 140 is configured to output the word line signal through the word lines WL to the memory cells 122, and the sense amplifier circuit 160 is configured to output the bit line and source line signals through the bit lines BL and the source lines SL to the memory cells 122.

In some embodiment, with reference to FIG. 1, FIG. 2, and FIG. 3, the recover circuit 180 is configured to output the word line signal and/or the bit line and source line signals in the recover operation through the driver circuit 140 and/or the sense amplifier circuit 160. Alternatively stated, during the period P2, the word line signal and/or the bit line and source line signals are generated by the recover circuit 180 and transmitted through the driver circuit 140 and/or the sense amplifier circuit 160 to the memory cells 122. In some embodiments, during the period P2, the word line signal output by the recover circuit 180 during the period P2 is configured to have the voltage level V3 that is higher than the highest voltage level V2 of the word line signal output by the driver circuit 140 during the period P1.

Figure 4:
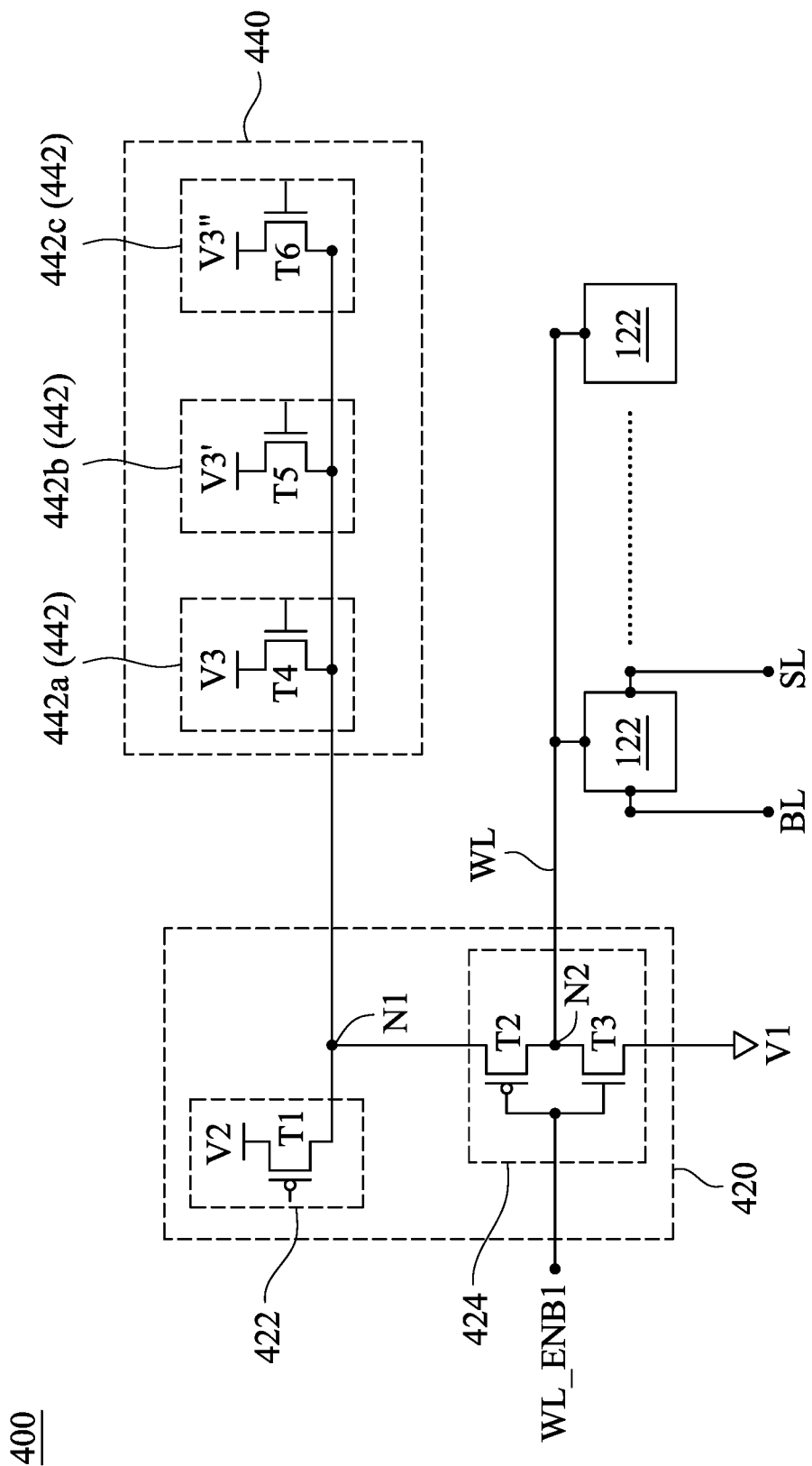
FIG. 4 is a schematic diagram of a portion of the memory device shown in FIG. 1, in accordance with some embodiments of the present disclosure.

Reference is now made to FIG. 4. FIG. 4 is a schematic diagram of a portion 400 of the memory device 100 shown in FIG. 1, in accordance with some embodiments of the present disclosure. The portion 400 includes a driver circuit 420, a recover circuit 440, and multiple memory cells 122. The memory cells 122 correspond to the memory cells arranged in the memory array 120 shown in FIG. 1 and to the memory cells 122 shown in FIG. 2, the driver circuit 420 corresponds to the driver circuit 140 as shown in FIG. 1, and the recover circuit 440 corresponds to the recover circuit 180.

For illustration, the driver circuit 420 includes a header unit 422 and a transmission unit 424, and the header unit 422 and the transmission unit 424 are coupled in series.

In some embodiments, the header unit 422 is configured to generate a reference voltage signal. The reference voltage signal generated by the header unit 422 has a voltage level of V2. In some embodiments, the header unit 422 includes a transistor T1. In various embodiments, the header unit 422 includes more than one transistor.

For illustration, the transmission unit 424 is coupled to multiple memory cells 122 and is configured to receive an enabling signal WL_ENB1. The transmission unit 424 includes transistors T2 and T3, the gate terminals of the transistors T2 and T3 are coupled together and configured to receive an enabling signal WL_ENB1, and the drain terminals of the transistors T2 and T3 are coupled together at a node N2. The transistors T2 and T3 are coupled to the memory cells 122 through a word line WL. The transistor T2 is coupled to the header unit 422 (specifically, to the drain terminal of the transistor T1) at a node N1.

In some embodiments, the transmission unit 424 includes an inverter, such as the one configured by the transistors T2 and T3. In various embodiments, the transmission unit 424 includes transistors other than the transistors T2 and T3.

For illustration, the recover circuit 440 includes three recover units 442a-442c coupled in parallel with the header unit 422 of the driver circuit 420 at the node N1. In the present disclosure, the recover units 442a-442 are collectively referred to as the recover units 442.

In various embodiments, the recover circuit 440 includes only one recover unit 442. In various embodiments, the recover circuit 440 includes more than three recover units 442.

In some embodiments, the recover units 442 are configured to generate operation voltage signals that are configured to have voltage levels higher than a voltage level of first reference voltage signal generated by the header unit 422. For illustration of FIG. 4, the recover units 442a-442c are configured to generate operation voltage signals having voltage levels of V3, V3', and V3" respectively, and V3, V3', and V3" are all higher than V2.

For illustration, each of the recover units 442a-442c includes a transistor. The recover unit 442a includes a transistor T4, the recover unit 442b includes a transistor 15, and the recover unit 442c includes a transistor T6. In various embodiments, each of the recover units 442a-442c includes more than one transistor.

For illustration, one of the transistors T1 and T4-T6 is turned on in response to an enabling signal, and the transmission unit 424 is configured to transmit the voltage signal generated by the transistor that is turned on to the memory cells 122 through the word line WL.

For illustration, during the normal operation, the transistor T1 is turned on in response to an enabling signal received through its gate terminal, the voltage signal having voltage level V2 is transmitted to the transmission unit 424 (specifically, to the source terminal of the transistor T2), and the transmission unit 424, in response to the enabling signal WL_ENB1, transmits such voltage signal to the memory cells 122 through the word line WL.

For illustration, during the recover operation, the transistor T4 is turned on in response to an enabling signal received through its gate terminal, the voltage signal having voltage level V3 is transmitted to the transmission unit 424 (specifically, to the source terminal of the transistor T2), and the transmission unit 424, in response to the enabling signal WL_ENB1, transmits such voltage signal to the memory cells 122 through the word line WL.

In some embodiments, one or more of the driver circuit 420, the header unit 422, and the transmission unit 424 is arranged in the driver circuit 140 shown in FIG. 1, and the recover circuit 440 and/or the recover units 442 are arranged in the recover circuit 180 shown in FIG. 1.

In some embodiments, with reference to FIG. 3 and FIG. 4, during the period P1, the portion 400 operates in the normal operation, the transistor T1 is turned on, and the voltage signal with voltage level V2 is transmitted to the memory cells 122. Thus, as shown in FIG. 3, the word line signal has the highest level of voltage level V2 during the period P1. In some embodiments, at different times of the period P1, the transmission unit 424 is configured to transmit voltage signal with voltage level V1 to the memory cells 122 through the word line WL. For example, in the embodiments where the transistor T2 is a p-type metal-oxide-semiconductor (PMOS) transistor and the transistor T3 is a n-type metal-oxide-semiconductor (NMOS) transistor, in response to the enabling signal WL_ENB1 having a logic high or logic 1 value, the transistor T2 is turned off and the transistor T3 is turned on, and thus the voltage signal with voltage level V1 is transmitted to the memory cells 122.

In some embodiments, with reference to FIG. 3 and FIG. 4, during the period P2, the portion 400 operates in the recover operation, the transistor T3 is turned on, and the voltage signal with voltage level V3 is transmitted to the memory cells 122. Thus, as shown in FIG. 3, the word line signal has the highest level of voltage level V3 during the period P2. Through the voltage difference between the word line WL and the bit line BL and source line SL during time t5-t6, which equals (|V3|+|V1|), the memory cell is recovered from performance degradation.

For illustration to FIG. 4, V3' is higher than V3, and V3" is higher than V3' and V3. In some embodiments, one of the voltage signals with voltage levels V3, V3', and V3" is selected and transmitted to the memory cells 122 based on the number of normal operations that the memory cells 122 have gone through. For example, every time the memory cells 122 have gone through 1000 times of normal operations, the voltage signal with voltage level V3 is transmitted to the memory cells 122 to recover them. However, when the memory cells 122 have gone through normal operations much more than 1000 times, the de-trap effect brought by the electric field generated by the voltage level V3 is not enough to fully recover the memory cells 122, and thus higher voltage level, such as V3' or V3", is needed to recover the memory cells 122. Thus, in some embodiments, every time the memory cells 122 have gone through 5000 times of normal operations, the voltage signal with voltage level V3' is transmitted to the memory cells 122 to recover them, and every time the memory cells 122 have gone through 10000 times of normal operations, the voltage signal with voltage level V3" is transmitted to the memory cells 122 to recover them.

The numbers of normal operations and their corresponding voltage levels are given for illustrative purposes. Various numbers and voltage levels are within the contemplated scope of the present disclosure. For example, the voltage signal with voltage level V3 is selected every time the memory cells 122 have gone through 100 times of normal operations, the voltage signal with voltage level V3' is selected every time the memory cells 122 have gone through 1000 times of normal operations, and the voltage signal with voltage level V3" is selected every time the memory cells 122 have gone through 10000 times of normal operations.

In some embodiments, the timer circuit 182 in FIG. 1 or the enabling circuit 110 in FIG. 1 is included in the portion 400 and is configured to count the number of performed normal operations and enable one of the recover units 442a-442c based on such number.

Figure 5:
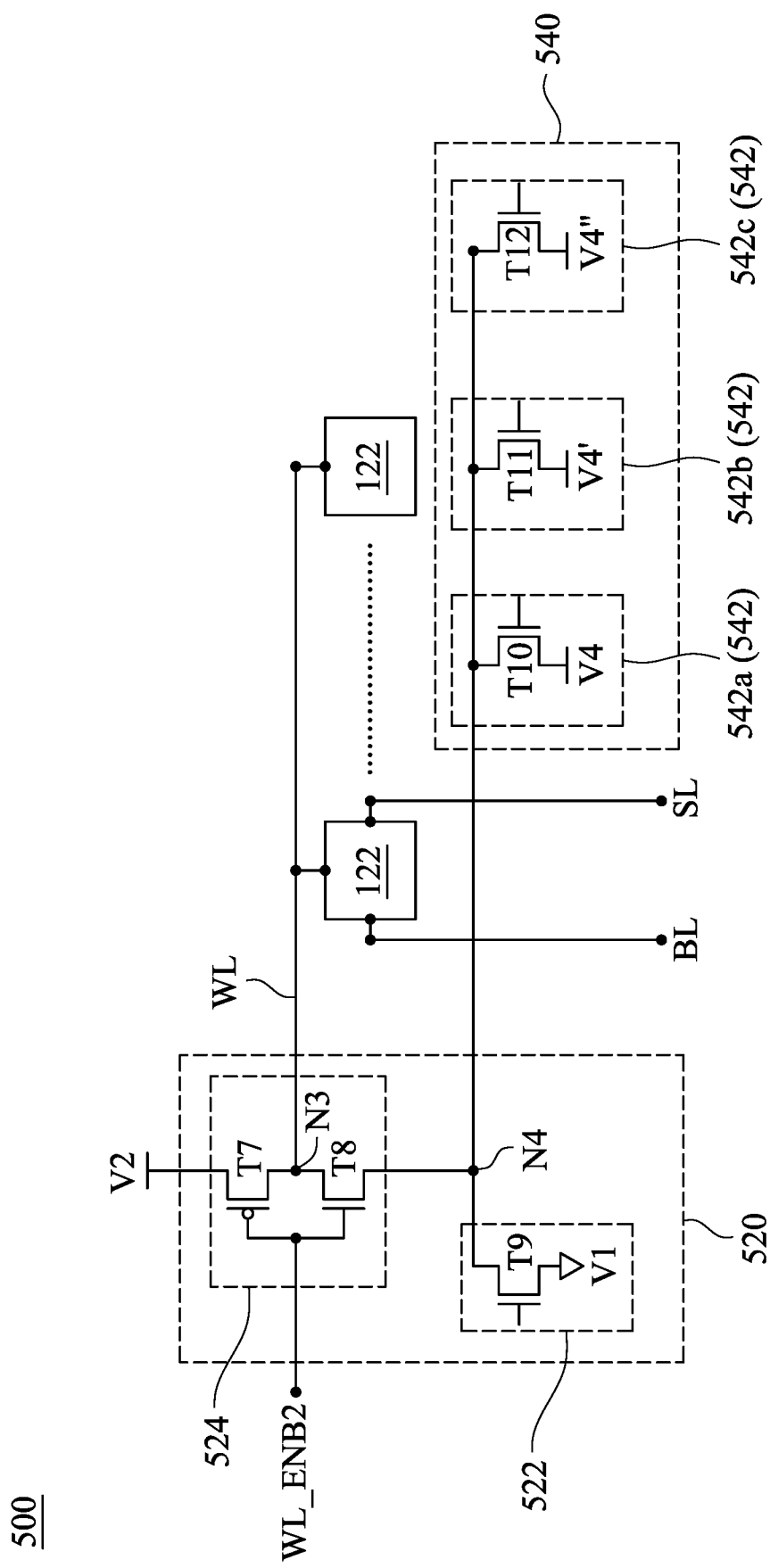
FIG. 5 is a schematic diagram of a portion of the memory device shown in FIG. 1, in accordance with various embodiments of the present disclosure.

Reference is now made to FIG. 5. FIG. 5 is a schematic diagram of a portion 500 of the memory device 100 shown in FIG. 1, in accordance with various embodiments of the present disclosure. The portion 500 includes a driver circuit 520, a recover circuit 540, and multiple memory cells 122. The memory cells 122 correspond to the memory cells arranged in the memory array 120 shown in FIG. 1 and to the memory cells 122 shown in FIG. 2, the driver circuit 520 corresponds to the driver circuit 140 as shown in FIG. 1, and the recover circuit 540 corresponds to the recover circuit 180.

For illustration, the driver circuit 520 includes a footer unit 522 and a transmission unit 524, and the footer unit 522 and the transmission unit 524 are coupled in series.

For illustration, the footer unit 522 is configured to generate a reference voltage signal. The reference voltage signal generated by the footer unit 522 has the voltage level of V1. The footer unit 522 includes a transistor T9. In various embodiments, the footer unit 522 includes more than one transistor.

For illustration, the transmission unit 524 is coupled to multiple memory cells 122 and is configured to receive an enabling signal WL_ENB2. The transmission unit 524 includes transistors T7 and T8, the gate terminals of the transistors T7 and T8 are coupled together, and the drain terminals of the transistors T7 and T8 are coupled together at a node N3. The transistors T7 and T8 are coupled to the memory cells 122 through a word line WL. The transistor T8 is coupled to the footer unit 522 (specifically, the drain terminal of the transistor T9) at a node N4.

In some embodiments, the transmission unit 524 includes an inverter, such as the one configured by the transistors T7 and T8. In various embodiments, the transmission unit 524 includes transistors other than the transistors T7 and T8.

For illustration, the recover circuit 540 includes recover units 542 coupled in parallel with the footer unit 522 of the driver circuit 520. For example, in the embodiment of FIG. 5, there are three recover units 542a-542c, which are coupled to the node N4. In various embodiments, the recover circuit 540 includes only one recover unit 542. In various embodiments, the recover circuit 540 includes more than three recover units 542.

For illustration, the recover units 542 are configured to generate operation voltage signals that are configured to have voltage levels lower than a voltage level of first reference voltage signal generated by the footer unit 522. For example, the recover units 542a-542c are configured to generate operation voltage signals having voltage levels of V4, V4', and V4" respectively, and V4, V4', and V4" are all lower than V1.

For illustration, each of the recover units 542a-542c includes a transistor. For example, the recover unit 542a includes a transistor T10, the recover unit 542b includes a transistor T11, and the recover unit 542c includes a transistor T12. In various embodiments, each of the recover units 542a-542c includes more than one transistor.

For illustration, one of the transistors T9 and T10-T12 is turned on in response to an enabling signal, and the transmission unit 524 is configured to transmit the voltage signal generated by the transistor that is turned on to the memory cells 122 through the word line WL.

For illustration, during the normal operation, the transistor T9 is turned on in response to an enabling signal received through its gate terminal, the voltage signal having voltage level V1 is transmitted to the transmission unit 524 (specifically, to the source terminal of the transistor T8), and the transmission unit 524, in response to the enabling signal WL_ENB2, transmits such voltage signal to the memory cells 122 through the word line WL.

For illustration, during the recover operation, the transistor T10 is turned on in response to an enabling signal received through its gate terminal, the voltage signal having the voltage level V4 is transmitted to the transmission unit 524 (specifically, to the source terminal of the transistor T8), and the transmission unit 524, in response to the enabling signal WL_ENB2, transmits such voltage signal to the memory cells 122 through the word line WL.

In some embodiments, one or more of the driver circuit 520, the footer unit 522, and the transmission unit 524 is arranged in the driver circuit 140 shown in FIG. 1. In some embodiments, the recover circuit 540 and/or the recover units 542 are arranged in the recover circuit 180 shown in FIG. 1.

Figure 6:
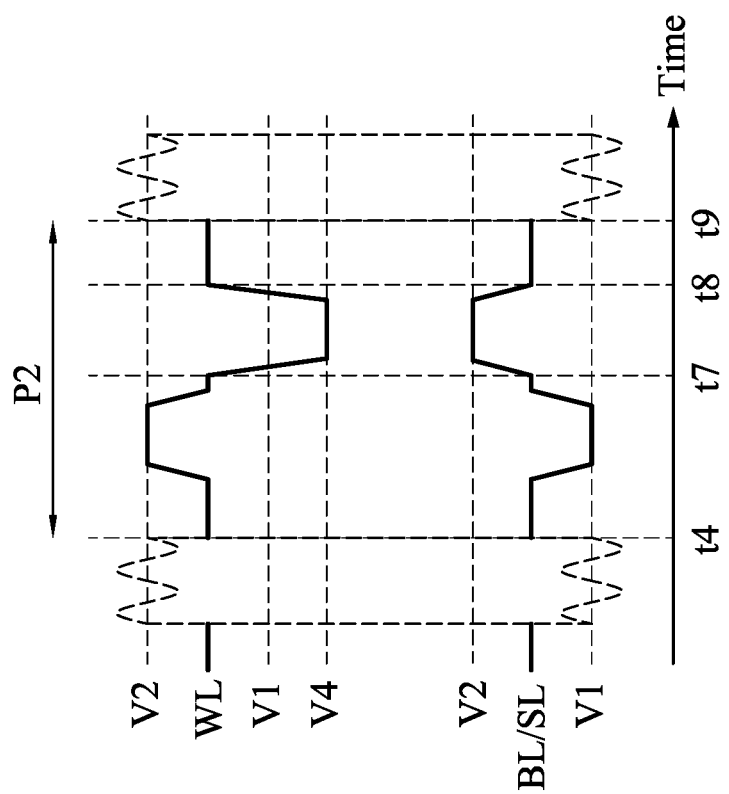
FIG. 6 is a waveform diagram of word line, bit line, and source line signals transmitted in the memory device shown in FIG. 5, in accordance with some embodiments of the present disclosure.

Reference is now made to FIGS. 3, and 5-6. FIG. 6 is a waveform diagram of word line, bit line, and source line signals transmitted in the portion 500 shown in FIG. 5, in accordance with some embodiments of the present disclosure. In FIG. 6, the waveform of the voltage signal that the word line WL shown in FIG. 5 receives is denoted as "WL", and the waveform of the voltage signals that the bit line BL and the source line SL shown in FIG. 5 receive is denoted as "BL/SL". Also, FIG. 6 depicts only the waveforms of the signals mentioned above during time t4-t9, while the waveforms before time t4 and after time t9 are the same as the waveforms shown in FIG. 3.

In some embodiments, during the period P2, the portion 500 operates in the recover operation, and, before time t4, the portion 500 operates in the normal operation.

For illustration, during the normal operation, the transistor T9 is turned on, and the voltage signal with voltage level V1 is transmitted to the memory cells 122.

For illustration, during the period P2, the portion 500 operates in the recover operation, the transistor T10 is turned on, and the voltage signal with voltage level V4 is transmitted to the memory cells 122. Thus, as shown in FIG. 6, the word line signal, during the period P2, has a lowest level of the voltage level V4. Through the voltage difference between the bit line BL and source line SL and the word line WL during time t7-t8, which equals (|V2|+|V4|), the memory cell is recovered from performance degradation.

For illustration, V4' is lower than V4, and V4" is lower than V4' and V4. One of the voltage signals with voltage levels V4, V4', and V4" is transmitted to the memory cells 122 when the memory cells 122 have gone through different numbers of normal operations. For example, every time the memory cells 122 have gone through 1000 times of normal operations, the voltage signal with voltage level V4 is transmitted to the memory cells 122 to recover them; every time the memory cells 122 have gone through 5000 times of normal operations, the voltage signal with voltage level V4' is transmitted to the memory cells 122 to recover them; every time the memory cells 122 have gone through 10000 times of normal operations, the voltage signal with voltage level V4" is transmitted to the memory cells 122 to recover them. The numbers of performed normal operations and their corresponding voltage levels are merely exemplary, and different numbers and their corresponding voltage levels can be used in various embodiments.

In some embodiments, a timer circuit (such as the timer circuit 182 in FIG. 1) or enabling circuit (such as the enabling circuit 110 in FIG. 1) is included in the portion 500 and is configured to count the numbers of performed normal operations and enable one of the recover units 542a-542c according to such numbers.

As discussed above, the driver circuit 420 includes the header unit 422 configured to generate voltage signal with voltage level V2 and the recover units 442 configured to generate voltage signal higher than V2, and the driver circuit 520 includes the footer unit 522 configured to generate voltage signal with voltage level V1 and the recover units 542 configured to generate voltage signal lower than V1. In some embodiments, a memory device includes, other than a transmission unit such as the transmission unit 424 or 524, a header unit similar to the header unit 422, a footer unit similar to the footer unit 522, and recover units similar to the recover units 442 and 542. Through such configuration, the memory devices can generate a word line signal that, during time t5-t6, has a waveform similar to the one of the word line signal shown in FIG. 3 and, during time t7-t8, has a waveform similar to the one of the word line signal shown in FIG. 6.

Figure 7:
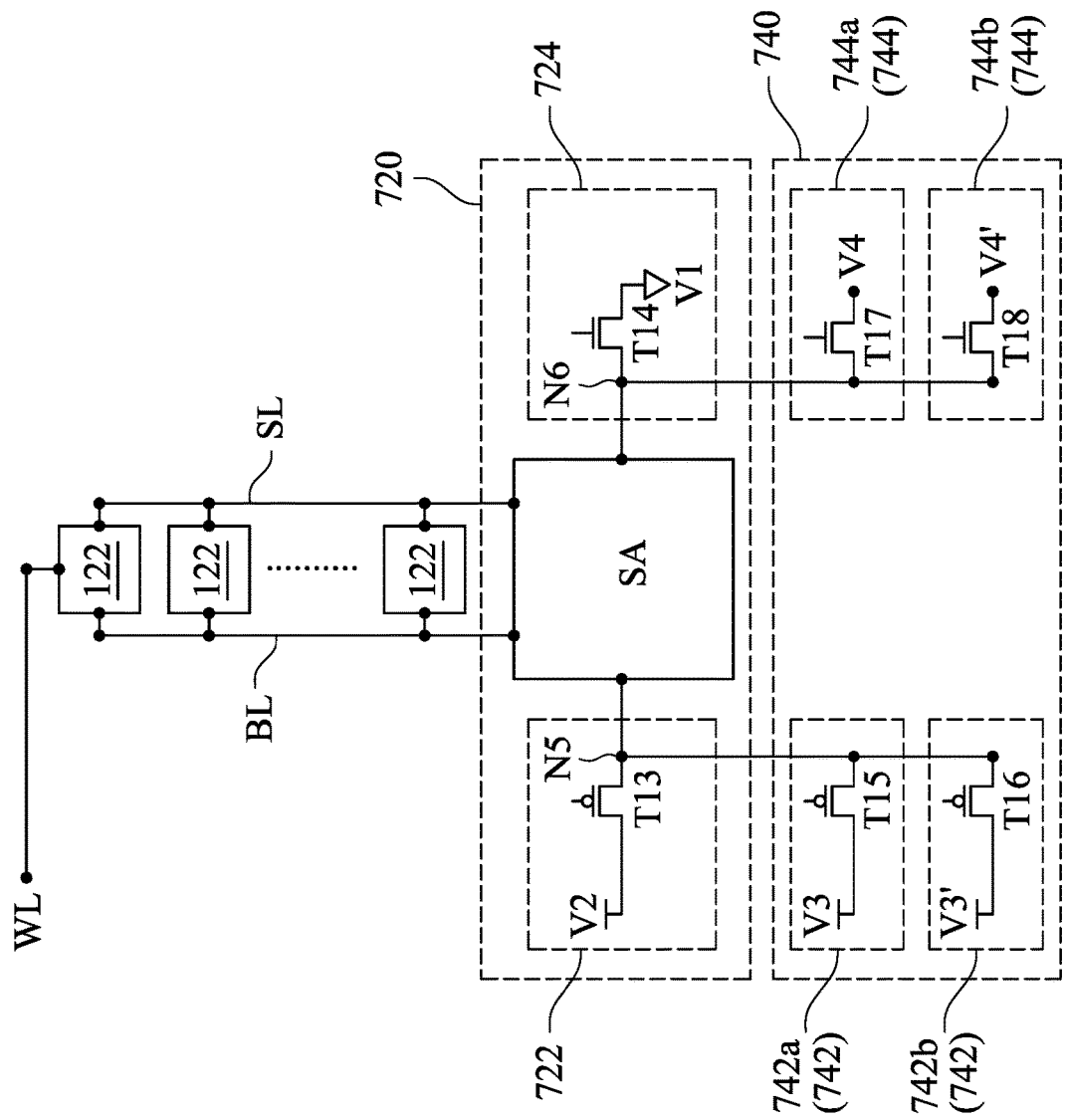
FIG. 7 is a schematic diagram of a portion of the memory device shown in FIG. 1, in accordance with various embodiments of the present disclosure.

Reference is now made to FIG. 7. FIG. 7 is a schematic diagram of a portion 700 of the memory device 100 shown in FIG. 1, in accordance with various embodiments of the present disclosure. The portion 700 includes a sense amplifier circuit 720, a recover circuit 740, and multiple memory cells 122. The sense amplifier circuit 720 corresponds to the sense amplifier circuit 160 shown in FIG. 1. In some embodiments, the sense amplifier circuit 720 includes a driver circuit (not shown) and is referred to as a driver circuit. The recover circuit 740 corresponds to the recover circuit 180 shown in FIG. 1.

For illustration, the sense amplifier circuit 720 includes a header unit 722, a sense amplifier unit SA, and a footer unit 724. The header unit 722 is configured to generate a reference voltage signal having the voltage level V2, and the footer unit 724 is configured to generate a reference voltage signal having the voltage level V1.

For illustration, the sense amplifier unit SA is coupled to the header unit 722 and the footer unit 724 and coupled to the memory cells 122 through a bit lien BL and a source line SL. The sense amplifier unit SA is configured to output the reference voltage signal having the voltage level V2 or the reference voltage signal having the voltage level V1 to the memory cell 122 through the bit line BL and the source line SL.

For illustration, the header unit 722 includes a transistor T13, and the footer unit 724 includes a transistor T14.

In various embodiments, the header unit 722 includes more than one transistor. In various embodiments, the footer unit 724 includes more than one transistor. In various embodiments, the sense amplifier circuit 720 includes only one of the header unit 722 and the footer unit 724.

For illustration, the recover circuit 740 includes recover units 742a-742b coupled in parallel with the header unit 722 and recover units 744a-744b coupled in parallel with the footer unit 724. The recover units 742a-742b are configured to generate operation voltage signals having voltage levels V3 and V3', and the voltage levels V3 and V3' are higher than the voltage level V2. The recover units 744a-744b are configured to generate operation voltage signals having voltage levels V4 and V4', and the voltage levels V4 and V4' are lower than the voltage level V1. The numbers of the recover units 742 and 744 are merely exemplary, and the recover circuit 740 can include different numbers of the recover units 742 and 744 in various embodiments.

For illustration, the recover unit 742a includes a transistor T15, the recover unit 742b includes a transistor T16, the recover unit 744a includes a transistor T17, and the recover unit 744b includes a transistor T18. In various embodiments, each of the recover units 742a-742b and 744a-744b can have more than one transistor.

In some embodiments, the recover circuit 740 includes only the recover unit(s) 742 coupled in parallel with the header unit 722 (that is, the recover units 742a-742b) or the recover unit(s) 742 coupled in parallel with the footer unit 724 (that is, the recover units 744a-744b).

In some embodiments, one or more of the sense amplifier circuit 720, the header unit 722, the sense amplifier unit SA, and the footer unit 724 is arranged in the sense amplifier circuit 160 shown in FIG. 1. In some embodiments, the recover circuit 740 and/or the recover units 742 and 744 are arranged in the recover circuit 180 shown in FIG. 1.

Figure 8A:
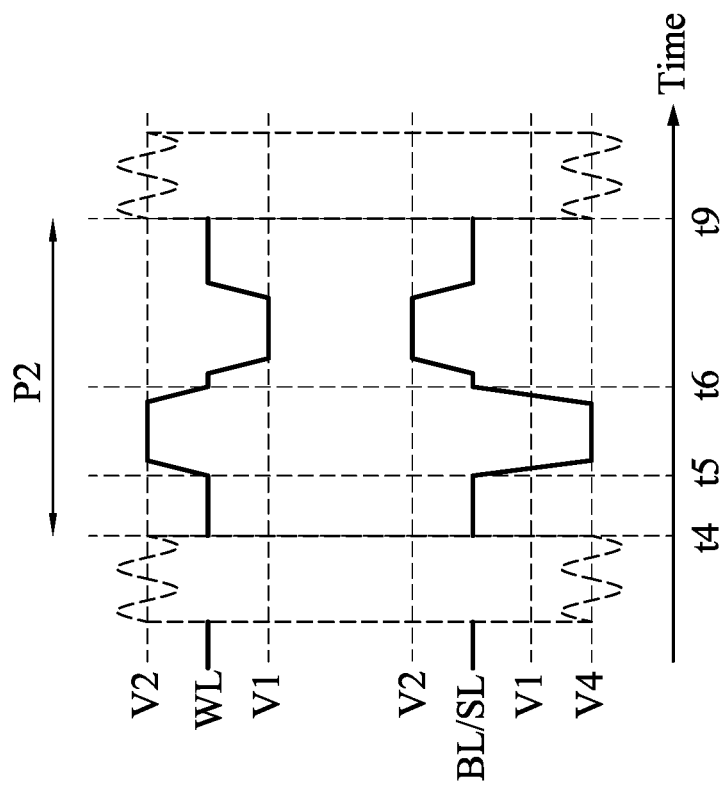
FIGS. 8A and 8B are waveform diagrams of word line, bit line, and source line signals transmitted in the memory device shown in FIG. 7, in accordance with some embodiments of the present disclosure.

Reference is now made to FIG. 7 and FIG. 8A. FIG. 8A is a waveform diagram of word line, bit line, and source line signals transmitted in the portion 700 shown in FIG. 7, in accordance with some embodiments of the present disclosure. In FIG. 8A, the waveform of the voltage signal that the word line WL shown in FIG. 7 receives is denoted as "WL", and the waveform of the voltage signals that the bit line BL and the source line SL shown in FIG. 7 receive is denoted as "BL/SL". Also, FIG. 8A depicts only the waveforms of the signals mentioned above during time t4-t9, while the waveforms before time t4 and after time t9 is the same as the waveforms shown in FIG. 3.

In some embodiments, during the period P2, the portion 700 operates in the recover operation, and, before time t4, the portion 700 operates in the normal operation.

In some embodiments, with reference to FIG. 7 and FIG. 8A, during the normal operation, the transistors T13 and T14 are turned on, and the voltage signals with voltage levels V2 and V1 are transmitted to the memory cells 122.

For illustration, during the period P2, the portion 700 operates in the recover operation, the transistor T15 is turned on, and the voltage signal with voltage level V3 is transmitted to the memory cells 122. Thus, as shown in FIG. 8A, the bit line and source line signals have the highest levels of voltage level V3 during the period P2. Through the voltage difference between the bit line BL and source line SL and the word line WL during time t7-t8, which equals (|V3|+|V1|), the memory cell 122 is recovered from performance degradation.

For illustration, V3' is higher than V3. One of the voltage signals with voltage levels V3 and V3' is transmitted to the memory cells 122 when the memory cells 122 have gone through different numbers of normal operations.

Figure 8B:
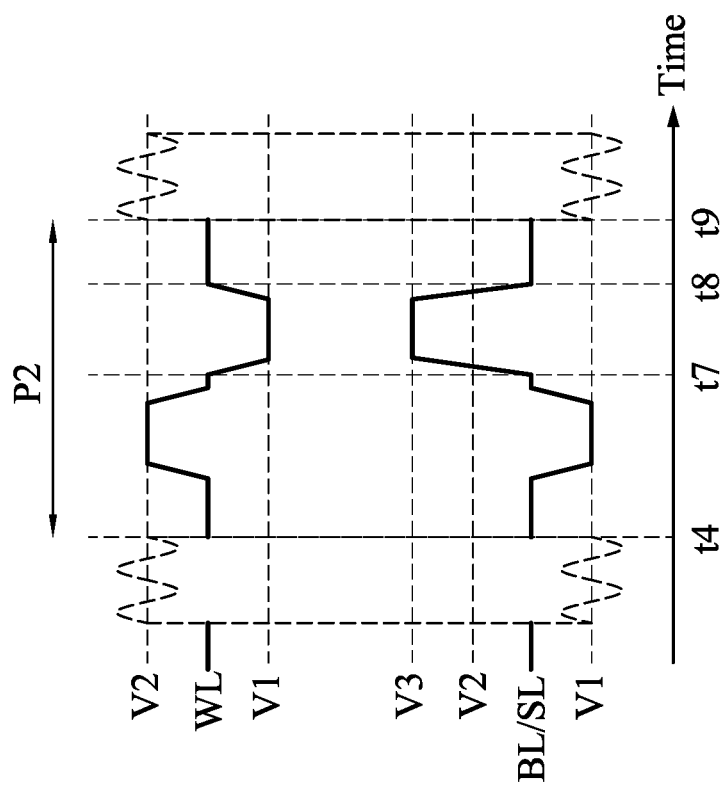

Reference is now made to FIGS. 7 and 8B. FIG. 8B is a waveform diagram of word line, bit line, and source line signals transmitted in the portion 700 shown in FIG. 7, in accordance with some embodiments of the present disclosure. In FIG. 8B, the waveform of the voltage signal that the word line WL shown in FIG. 7 receives is denoted as "WL", and the waveform of the voltage signals that the bit line BL and the source line SL shown in FIG. 7 receive is denoted as "BL/SL". Also, FIG. 8B depicts only the waveforms of the signals mentioned above during time t4-t9, while the waveforms before time t4 and after time t9 is the same as the waveforms shown in FIG. 3.

In some embodiments, during the period P2, the portion 700 operates in the recover operation, and, before time t4, the portion 700 operates in the normal operation.

For illustration, during the period P2, the portion 700 operates in the recover operation, the transistor T17 is turned on, and the voltage signal with voltage level V4 is transmitted to the memory cells 122. Thus, as shown in FIG. 8B, the bit line and source line signals, during the period P2, have lowest levels of voltage level V4. Through the voltage difference between the bit line BL and source line SL and the word line WL during time t5-t6, which equals (|V2|+|V4|), the memory cell 122 is recovered from performance degradation.

For illustration, V4' is lower than V4. One of the voltage signals with voltage levels V4 and V4' is transmitted to the memory cells 122 when the memory cells 122 have gone through different numbers of normal operations.

For illustration, when the portion 700 is performed in the recover operation, the transistors T15 and T17 are turned on, while the transistors T13 and T14 are turned off. Through such configuration, the portion 700 can generate bit line and source line signals that, during time t5-t6, have a waveform similar to the one of the bit line and source line signals shown in FIG. 8B, and, during time t7-t8, has a waveform similar to the one of the bit line and source line signals shown in FIG. 8A.

In some embodiments, with reference to FIG. 1 and FIG. 7, the sense amplifier circuit 160 of the memory device 100 further includes a detecting circuit (not shown in FIG. 1) configured to detect a current change associated with at least one of the data line or the source line, and when the current change exceeds a threshold value, configured to enable the recover circuit 180 to perform the recover operation. The sense amplifier unit SA in FIG. 7 is configured as the detecting circuit discussed above. The sense amplifier unit SA is configured to detect a current change associated with the bit line BL and the source line SL, and when the current change exceeds a threshold value, configured to enable the recover circuit 740 to perform the recover operation.

In some embodiments, after a large number of normal operations have been performed to the memory cells, charge trap happens in the transistors in the memory cells 122, the trapped charges make it harder to use the word line voltage signal to control the channel of the transistor of each memory cells, and thus the current passing through the channel of the transistor becomes lower. As the sense amplifier unit SA is typically used to detect the currents passing through the bit line BL and the source line SL during a read operation, in some embodiments, the sense amplifier unit SA is configured to detect the current caused by charge trap. In some embodiments, when detecting the current change exceeds a threshold value, the sense amplifier unit SA is configured to enable a recover circuit (such the recover circuit 180 or 740 shown in FIGS. 1 and 7) to perform the recover operation. In some embodiments, the sense amplifier unit SA is configured to transmit an enabling signal to the recover circuit 180, and the recover circuit 180 is configured to enable the recover operation.

In some embodiments, during the time that the recover operation is being performed in response to the sense amplifier circuit detecting that the current change exceeds the threshold value, the sense amplifier circuit is configured to monitor the current change. When the current change is equal to or lower than the threshold value, the sense amplifier circuit is configured to enable the normal operation. Alternatively stated, if the sense amplifier circuit detects that the current change becomes lower than or equal to the threshold value due to a number of performed recover operations, the sense amplifier circuit then enables the normal operation.

In some embodiments, with reference to FIG. 1 and FIG. 7, the sense amplifier unit SA is coupled to the reference memory cell column 130 shown in FIG. 1, which includes memory cells that have gone through less normal operations, relative to the memory cell 122 arranged in the memory array 120 have gone through. In some embodiments, the sense amplifier unit SA is configured to detect the currents passing through the memory cells arranged in the memory array 120 and the reference memory cell column 130, compare the two currents, and determine whether to enable the recover operation based on the difference between the currents.

In some embodiments, with reference to FIG. 1 and FIG. 7, the memory device 100 further includes an enabling circuit (not shown in FIG. 1) configured to enable, periodically and when a current change associated with at least one of the data line or the source line exceeds a threshold value, the recover circuit to perform the recover operation. In some embodiments, such enabling circuit is implemented through the timer circuit 182 shown in FIG. 1 and the sense amplifier unit SA shown in FIG. 7. Alternatively stated, the enabling circuit, through the timer circuit 182, counts the number of performed normal operation. When the number reaches a certain value, the enabling circuit, through the sense amplifier unit SA, enables the recover circuit to perform the recover operation. Thus, the enabling circuit enables the recover circuit to perform the recover operation periodically; additionally, the enabling circuit detects the current change of the bit line and the source line and, when the current change exceeds a threshold value, enables the recover circuit to perform the recover operation.

Figure 9B:
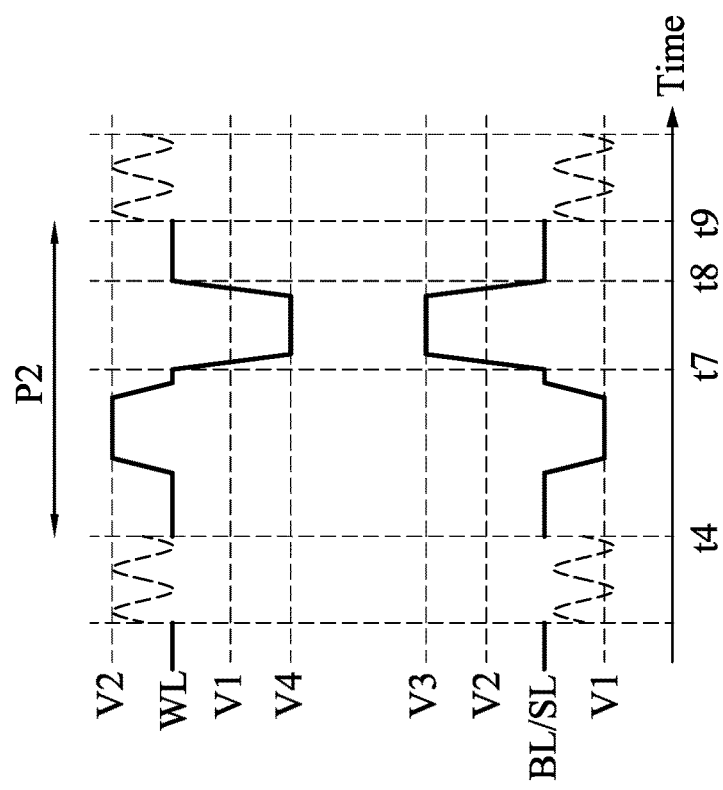
FIGS. 9A and 9B are waveform diagrams of word line, bit line, and source line signals received by one or more of the memory cells shown in FIG. 2, in accordance with various embodiments of the present disclosure.
Figure 9A:
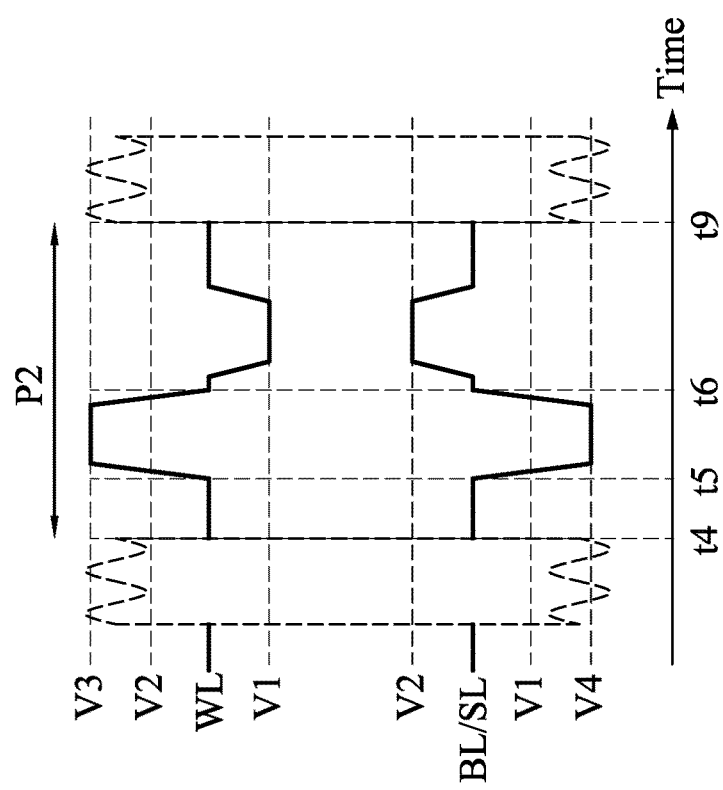

Reference is now made to FIG. 9A. FIG. 9A is a waveform diagram of word line, bit line, and source line signals received by one or more of the memory cells 122 shown in FIG. 2, in accordance with various embodiments of the present disclosure. In FIG. 9A, the waveform of the voltage signal that the word line WL shown in FIG. 2 receives is denoted as "WL", and the waveform of the voltage signals that the bit line BL and the source line SL shown in FIG. 2 receive is denoted as "BL/SL". Also, FIG. 9A depicts only the waveforms of the signals mentioned above during time t4-t9, while the waveforms before time t4 and after time t9 is the same as the waveforms shown in FIG. 3.

As shown in FIG. 9A, during time t5-t6, the word line signal has the voltage level of V3, and the bit line and source line signals have the voltage level of V4. Alternatively stated, during such time, the voltage difference across the gate and source/drain terminals of the memory cell 122 is (|V3|+|V4|), which is larger than the voltage differences that the previous embodiments in FIGS. 3, 6, and 8A-8B have. As discussed above, the larger the voltage difference is, the stronger the de-trap effect is.

In some embodiments, a configuration combined the portions 400 and 700 can be used to implement the signals that have the waveforms shown in FIG. 9A. For example, the configuration includes a driver circuit coupled to the memory cells 122 through a word line WL (such as the driver circuit 420 in FIG. 4), a recover unit configured to output a voltage signal having the voltage level V3 to the memory cells 122 through the driver circuit (such as the recover unit 442a in FIG. 4), a sense amplifier circuit coupled to the memory cells 122 through a bit line BL and a source line SL (such as the sense amplifier circuit 720 in FIG. 7), and a recover unit configured to output a voltage signal having the voltage level V4 to the memory cells 122 through the sense amplifier circuit (such as the recover unit 744a in FIG. 7).

Reference is now made to FIG. 9B. FIG. 9B is a waveform diagram of word line, bit line, and source line signals received by one or more of the memory cells 112 shown in FIG. 2, in accordance with various embodiments of the present disclosure. In FIG. 9B, the waveform of the voltage signal that the word line WL shown in FIG. 2 receives is denoted as "WL", and the waveform of the voltage signals that the bit line BL and the source line SL shown in FIG. 2 receive is denoted as "BL/SL". Also, FIG. 9B depicts only the waveforms of the signals mentioned above during time t4-t9, while the waveforms before time t4 and after time t9 is the same as the waveforms shown in FIG. 3.

As shown in FIG. 9B, during time t7-t8, the word line signal has the voltage level of V4, and the bit line and source line signals have the voltage level of V3. Alternatively stated, during such time, the voltage difference across the source/drain and gate terminals of the memory cell 122 is (|V3|+|V4|), which is larger than the voltage differences that the previous embodiments in FIGS. 3, 6, and 8A-8B have.

In some embodiments, a configuration combined the portions 500 and 700 can be used to implement the signals that have the waveforms shown in FIG. 9B. For example, the configuration includes a driver circuit coupled to the memory cells 122 through a word line WL (such as the driver circuit 520 in FIG. 5), a recover unit configured to output a voltage signal having the voltage level V4 to the memory cells 122 through the driver circuit (such as the recover unit 542a in FIG. 5), a sense amplifier circuit coupled to the memory cells 122 through a bit line BL and a source line SL (such as the sense amplifier circuit 720 in FIG. 7), and a recover unit configured to output a voltage signal having the voltage level V3 to the memory cells 122 through the sense amplifier circuit (such as the recover unit 742a in FIG. 7).

Figure 10A:
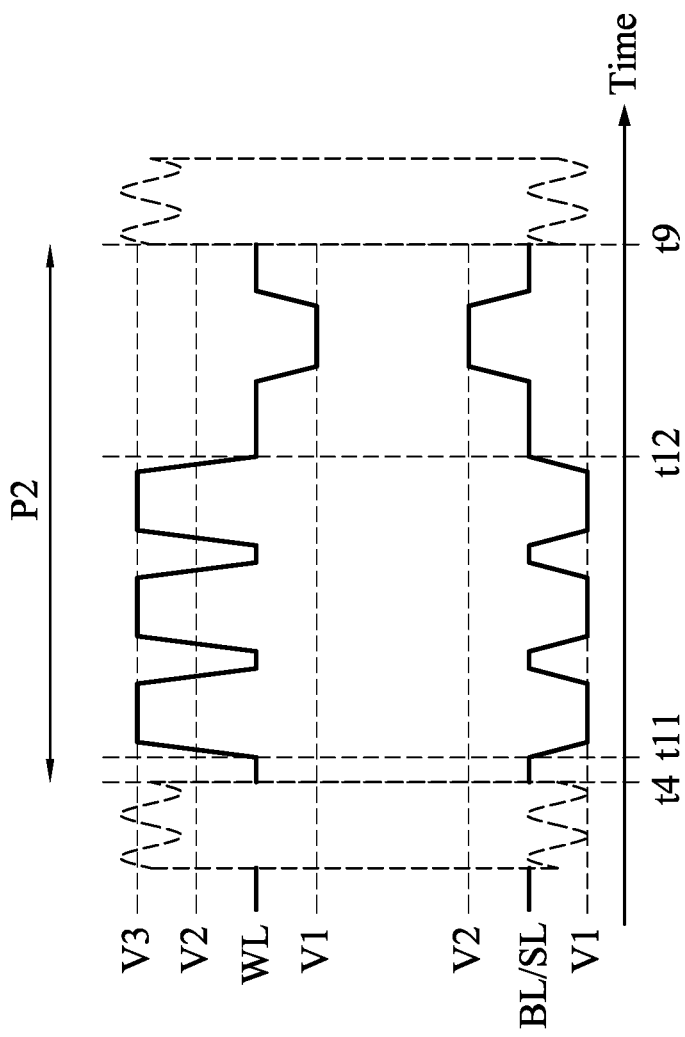
FIGS. 10A and 10B are waveform diagrams of word line, bit line, and source line signals received by one or more of the memory cells shown in FIG. 2, in accordance with various embodiments of the present disclosure.
Figure 10B:
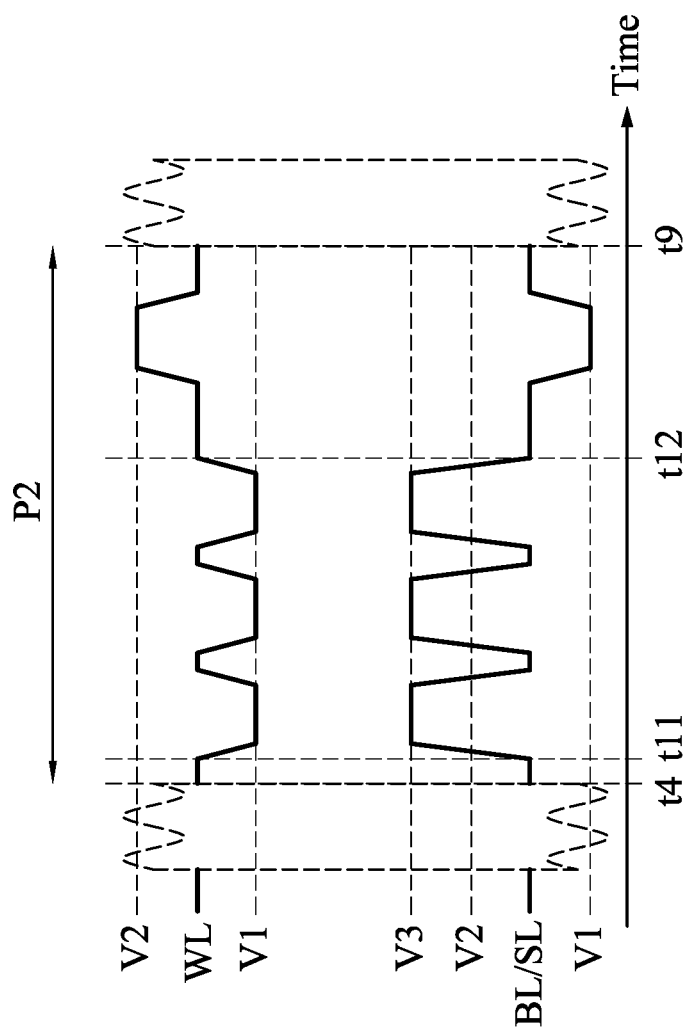

FIGS. 10A and 10B are waveform diagrams of word line, bit line, and source line signals received by one or more of the memory cells 122 shown in FIG. 2, in accordance with various embodiments of the present disclosure. In FIGS. 10A and 10B, the waveform of the voltage signal that the word line WL shown in FIG. 2 receives is denoted as "WL", and the waveform of the voltage signals that the bit line BL and the source line SL shown in FIG. 2 receive is denoted as "BL/SL". Also, FIGS. 10A and 10B depict only the waveforms of the signals mentioned above during time t4-t9, while the waveforms before time t4 and after time t9 are the same as the waveforms shown in FIG. 3.

As shown in FIG. 10A, during time t11-t12, the word line signal is configured to be asserted to have the voltage level V3 for three times continuously. Each time the word line signal has the voltage level V3 and the bit line and source line signals have the voltage level V1, the voltage difference (|V3|+|V1|) is configured to recover the memory cell 122 receiving such voltage signals.

As shown in FIG. 10B, during time t11-t12, the bit line and source line signals are configured to be asserted to have the voltage level V3 for three times continuously. Each time the bit line and source line signals have the voltage level V3 and the word line signal has the voltage level V1, the voltage difference (|V3|+|V1|) is configured to recover the memory cell 122 receiving such voltage signals.

Figure 11A:
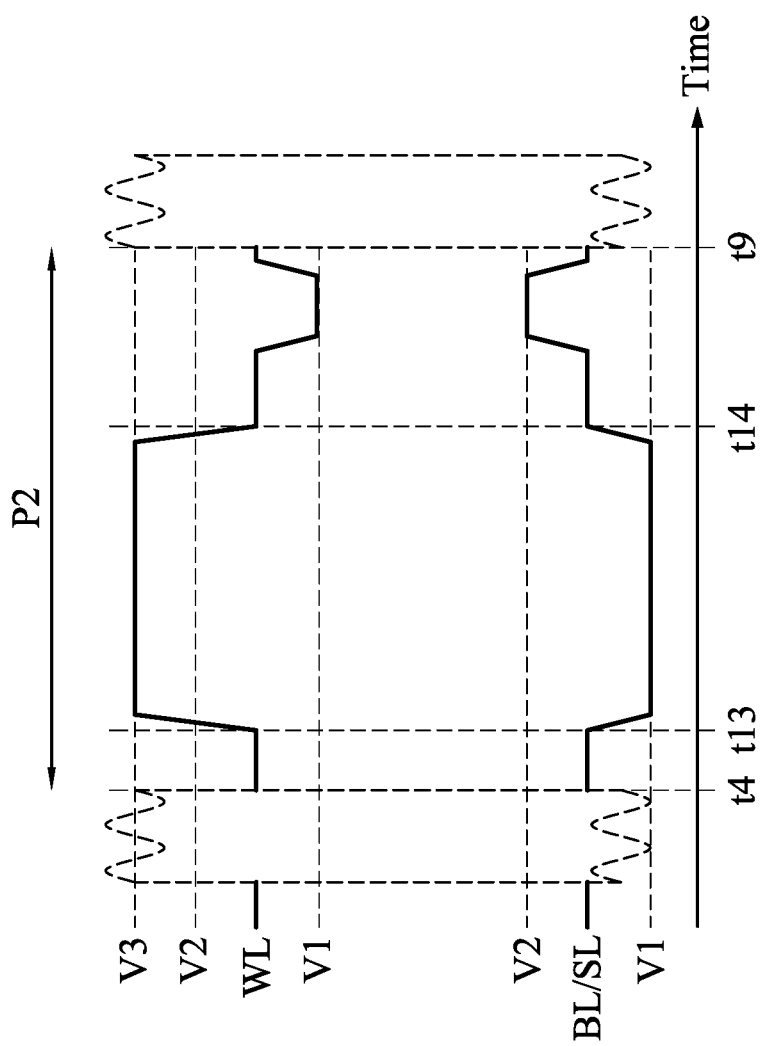
FIGS. 11A and 11B are waveform diagrams of word line, bit line, and source line signals received by one or more of the memory cells shown in FIG. 2, in accordance with various embodiments of the present disclosure.
Figure 11B:
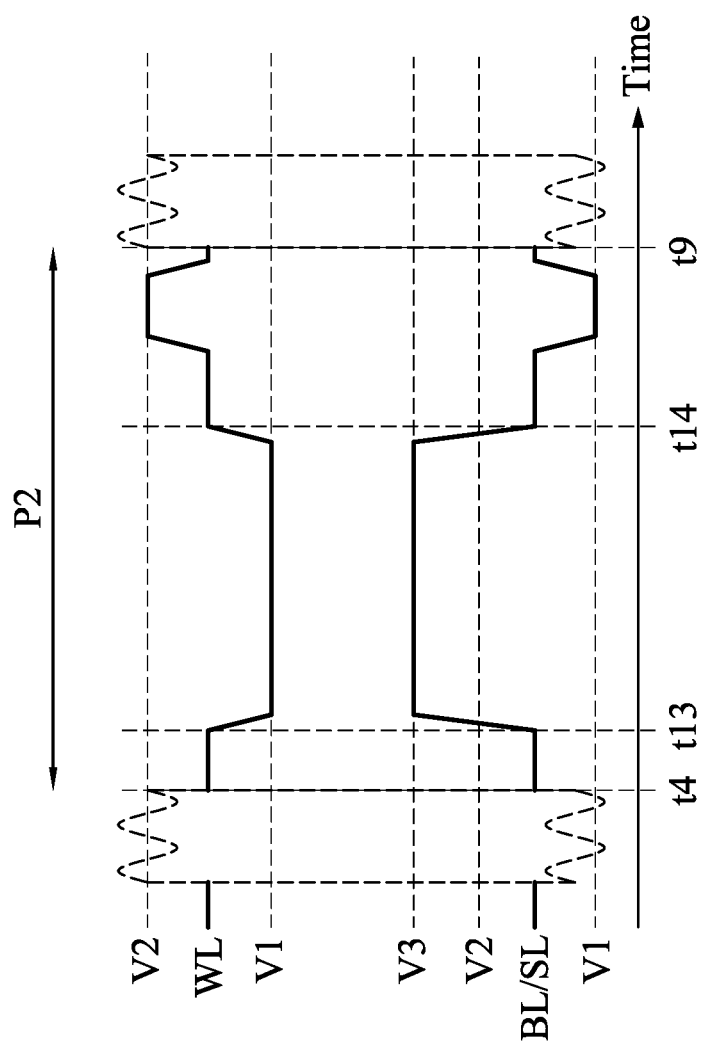

FIGS. 11A and 11B are waveform diagrams of word line, bit line, and source line signals received by one or more of the memory cells 122 shown in FIG. 2, in accordance with various embodiments of the present disclosure. In FIGS. 11A and 11B, the waveform of the voltage signal that the word line WL shown in FIG. 2 receives is denoted as "WL", and the waveform of the voltage signals that the bit line BL and the source line SL shown in FIG. 2 receive is denoted as "BL/SL". Also, FIGS. 11A and 11B depict only the waveforms of the signals mentioned above during time t4-t9, while the waveforms before time t4 and after time t9 is the same as the waveforms shown in FIG. 3.

As shown in FIG. 11A, during time t13-t14, the word line signal having the voltage level V3 is configured to have a pulse width that is greater than a pulse width of the word line signal or the bit line and source line signals has during the normal operation. For example, the pulse width of the word line signal having the voltage level V3 during time t13-t14 is greater than the pulse width of the word line signal or the bit line and source line signals has during the period P1 as shown in FIG. 3.

As shown in FIG. 11B, during time t13-t14, the bit line and source line signals having the voltage level V3 are configured to have a pulse width that is greater than a pulse width of the word line signal or the bit line and source line signals has during the normal operation. For example, the pulse width of the bit line and source line signals having the voltage level V3 during time t13-t14 is greater than the pulse width of the word line signal or the bit line and source line signals has during the period P1 as shown in FIG. 3.

In some embodiments, the greater or wider pulse width of the word line signal or the bit line and source line signals having the voltage level V3 brings better de-trap effect to the memory cells 122 in the recover operation, since the time that the voltage difference (|V3|+|V1|) exists between the word line and the bit line and source line is extended.

It is worth noted that the waveforms of word line, bit line, and source line signals shown in FIGS. 10A-10B and 11A-11B are merely exemplary. In various embodiments, word line, bit line, and source line signals of different voltage levels and/or waveforms can be used to recover the memory cells 122, as long as the voltage difference between the word line signal and the bit line and source line signals during the recover operation is larger than the voltage difference between them that is used to write or rewrite values into the memory cells 122 during the normal operations.

Figure 12:
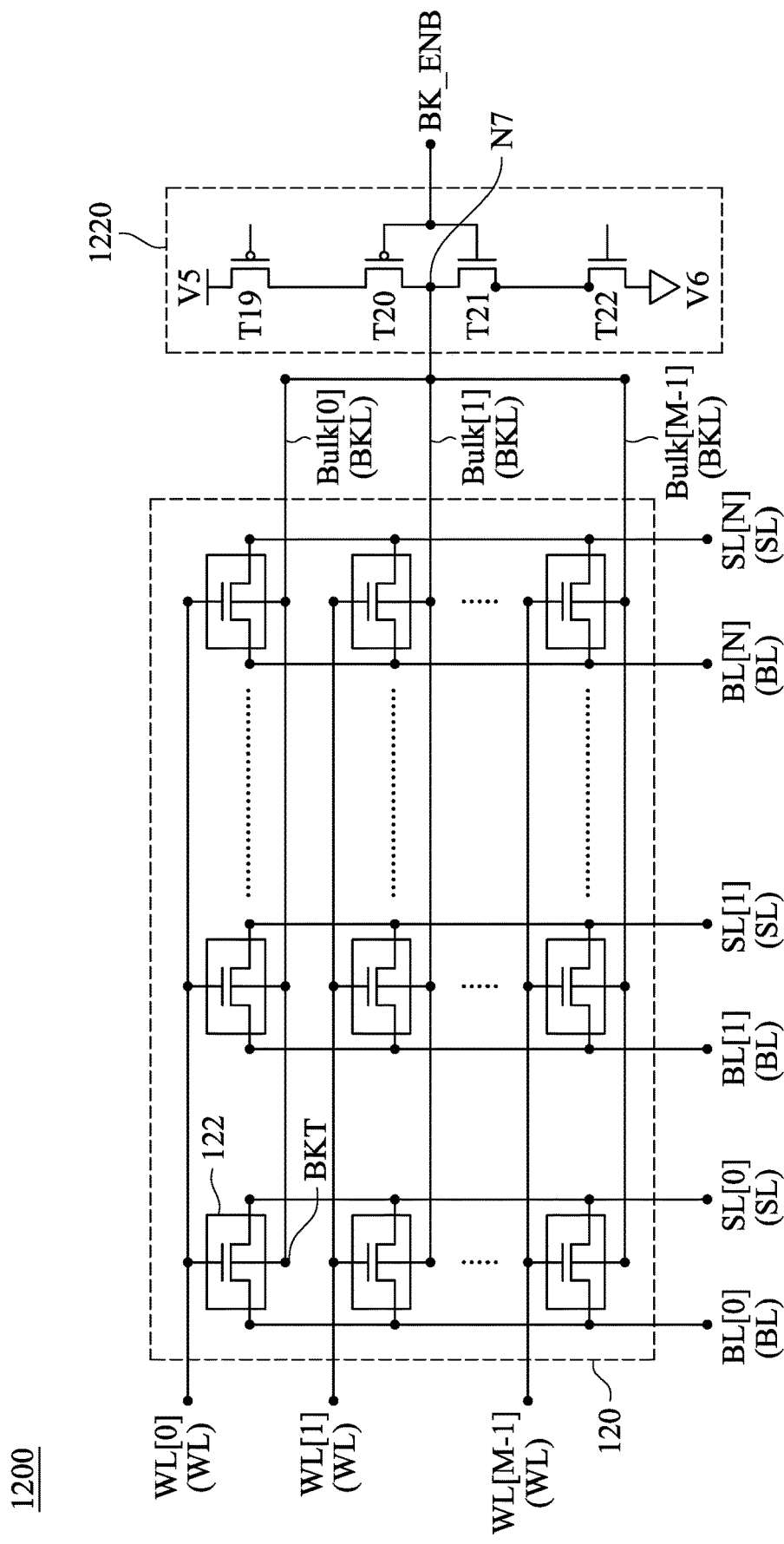
FIG. 12 is a schematic diagram of a portion of the memory device shown in FIG. 1, in accordance with various embodiments of the present disclosure.

Reference is now made to FIG. 12. FIG. 12 is a schematic diagram of a portion 1200 of the memory device 100 shown in FIG. 1, in accordance with various embodiments of the present disclosure. The portion 1200 includes the memory array 120 corresponding to the memory array 120 shown in FIG. 1 and a recover circuit 1220. The memory array 120 includes the memory cells 122. In some embodiments, each memory cell 122 includes a transistor, and each transistor of the memory cells 122 has a bulk terminal BKT that is coupled to the body or substrate of the transistor.

For illustration, the recover circuit 1220 is coupled to the bulk terminal BKT of the transistor of each memory cell 122 through bulk terminal lines BKL, and is configured to transmit a positive bias voltage signal or a negative bias voltage signal to the bulk terminal BKT of the transistor of each memory cell 122. The positive bias voltage signal has a voltage level V5, and V5 is positive. In some embodiments, the negative bias voltage signal has a voltage level V6, and V6 is negative.

For illustration, the recover circuit 1220 includes transistors T19-T22. The transistor T19 is configured to generate the positive bias voltage signal having the voltage level V5, and the transistor T22 is configured to generate the negative bias voltage signal having the voltage level V6. The transistors T21-T22 are configured as an inverter and configured to output one of the positive bias voltage signal and the negative bias voltage signal in response to an enabling signal BK_ENB. The gate terminals of the transistors T21-T22 are coupled together, and the drain terminals of the transistors T21-T22 are coupled with each other and to the bulk terminal lines BKL (that is, the bulk terminal lines Bulk[0]-Bulk[M−1]).

Figure 13:
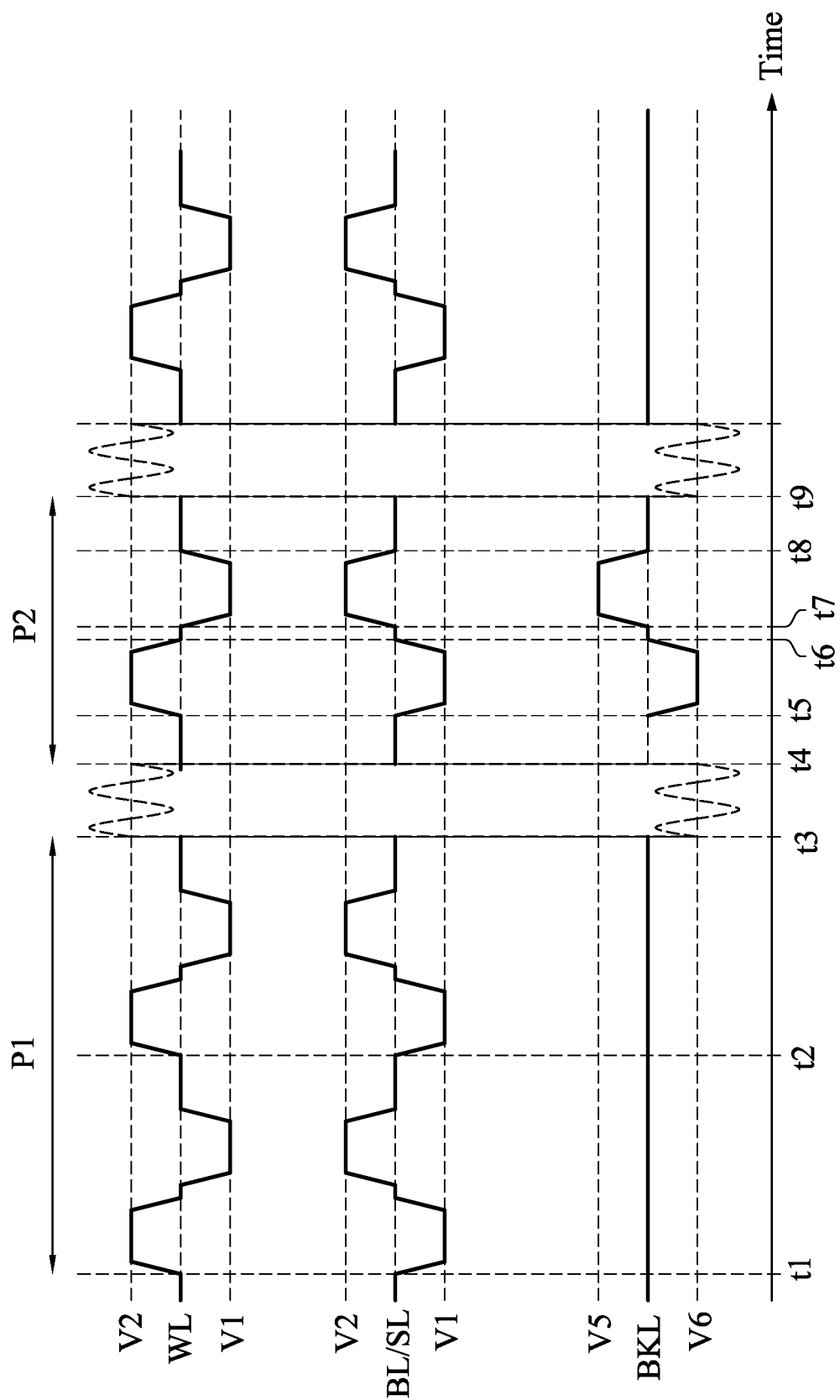
FIG. 13 is a waveform diagram of word line, bit line, source line, and bulk terminal line signals transmitted in the memory device shown in FIG. 12, in accordance with some embodiments of the present disclosure.

Reference is now made to FIG. 12 and FIG. 13. FIG. 13 is a waveform diagram of word line, bit line, source line, and bulk terminal line signals transmitted in the portion 1200 shown in FIG. 12, in accordance with some embodiments of the present disclosure. In FIG. 13, the waveform of the voltage signal that the word line WL shown in FIG. 12 receives is denoted as "WL", the waveform of the voltage signals that the bit line BL and the source line SL shown in FIG. 12 receive is denoted as "BL/SL", and the waveform of the voltage signal that the bulk terminal line BKL shown in FIG. 12 receives is denoted as "BKL".

During the period P1, the portion 1200 operates in the normal operation, and the word line, bit line, and source line signals have waveforms that are the same as the corresponding ones shown in FIG. 3. In some embodiments, during the period P1, the bulk terminal line voltage signal stays at 0V. In some embodiments, during the period P1, the recover circuit 1220 transmits no voltage signal to the bulk terminal BKT of the transistor of each memory cell 122.

During the period P2, the portion 1200 operates in the recover operation. In some embodiments, during the period P2, while the word line, bit line, and source line signals have waveforms that are the same as they have during the period P1, the bulk terminal line has a voltage level V6 during the time t5-t6 and a voltage level V5 during the time t7-t8. In some embodiments, V6 is negative, and V5 is positive. Alternatively stated, during time t5-t6 and t7-t8, when the bulk terminal line has positive voltage levels, the word line voltage signal has negative voltage levels, and vice versa. In some embodiments, the word line voltage signal and the bulk terminal line voltage signal are configured to control the channel of the transistor of the memory cell 122, for example, to broaden or narrow the width of the channel. In some embodiments, during time t5-t6 and t7-t8, the channel of the transistor of the memory cell 122 is broadened, and the memory cell 122 is recovered from performance degradation.

Figure 14:
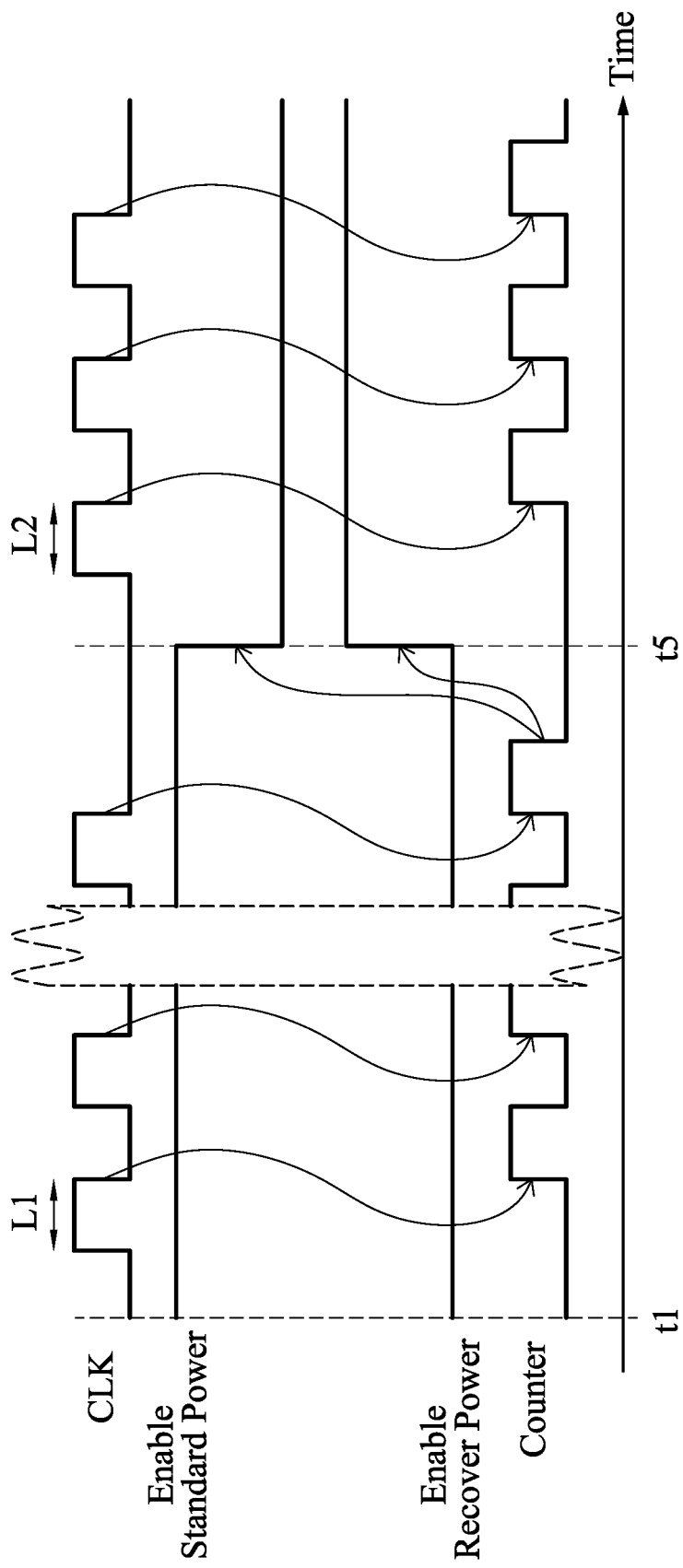
FIG. 14 is a waveform diagram of signals transmitted in the memory device shown in FIG. 1, in accordance with some embodiments of the present disclosure.

FIG. 14 is a waveform diagram of signals transmitted in the memory device 100 shown in FIG. 1, in accordance with some embodiments of the present disclosure. In FIG. 14, the waveform of a clock signal for the memory device 100 is denoted as "CLK", the waveform of an enabling signal configured to control the memory device 100 to perform the normal operation is denoted as "Enable Standard Power", the waveform of an enabling signal configured to control the memory device 100 to perform the recover operation is denoted as "Enable Recover Power", and the waveform of a counting signal generated by a timer circuit or counter circuit (such as the timer circuit 182 in FIG. 1) is denoted as "Counter."

In some embodiments, the Enable Standard Power signal having a logic 1 value is configured to control the memory device 100 to perform the normal operation. In some embodiments, the Enable Recover Power signal having a logic 1 value is configured to control the memory device 100 to perform the recover operation.

For illustration of FIG. 1 and FIG. 14, during time t1-t5, the memory device 100 operates in the normal operation, the Enable Standard Power signal is logic 1, and the Enable Standard Recover signal is logic 0. After time t5, the memory device 100 operates in the recover operation, the Enable Standard Power signal is logic 0, and the Enable Standard Recover signal is logic 1.

In some embodiments, the clock signal is configured to perform one normal operation or one recover operation. For illustration of FIG. 14, the counter signal is configured to have a rising edge in response to the clock signal having a falling edge. The clock signal is configured to have a falling edge in response to a performed operation. Alternatively stated, the counter signal indicates how many normal or recover operations that the memory device 100 has performed.

For illustration, during time t1-t5, when the counter signal indicates that the number of performed normal operations has reached a threshold value, the Enable Standard Power signal is configured to have a logic 0 value, and the Enable Recover Power signal is configured to have a logic 1 value. Alternatively stated, the memory device 100 is switched to operate in the recover operation when the threshold value is reached. In some embodiments, as shown in FIG. 14, the threshold value is reached right before t5, and the Enable Recover Power signal is configured to have logic 1 value in response to the counter signal.

In some embodiments, the pulse widths of the clock signal can vary when the memory device 100 operates in the normal operation during time t1-t5 and when the memory device 100 operates in the recover operation after time t5. For example, the clock signal has a pulse width L1 during time t1-t5 and has a pulse width L2 after time t5. In some embodiments, L2 is wider than L1, and the time when the memory device 100 performs one recover operation is longer than the time when the memory device 100 performs one normal operation.

Figure 15:
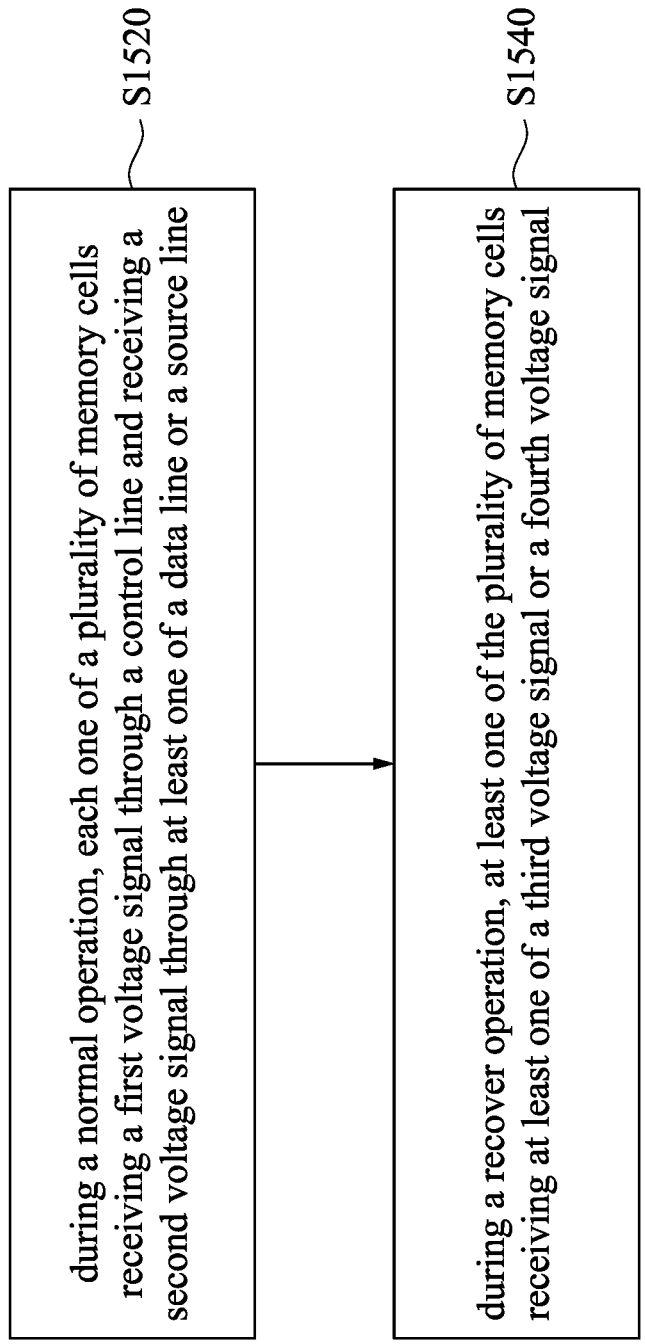
FIG. 15 is a flowchart of a method for operating the memory device shown in FIG. 1, in accordance with some embodiments of the present disclosure.

Reference is now made to FIG. 15. FIG. 15 is a flowchart of a method 1500 for operating the memory device 100 shown in FIG. 1, in accordance with some embodiments of the present disclosure. The method 1500 includes steps S1520 and S1540 and can be implemented through configurations of the memory devices disclosed in the previous embodiments.

At step S1520, during a normal operation, each one of a plurality of memory cells (such as each memory cell 122 in FIGS. 2, 4-5, and 7) receives a first voltage signal (such as the word line signal during the period P1 as shown in FIG. 3) through a control line (such as the word line WL in FIGS. 2, 4-5, and 7) and receives a second voltage signal (such as the bit line and source line signals during the period P1 as shown in FIG. 3) through at least one of a data line (such as the bit line BL in FIGS. 2, 4-5, and 7) or a source line (such as the source line SL in FIGS. 2, 4-5, and 7).

At step S1540, during a recover operation, at least one of the plurality of memory cells receives at least one of a third voltage signal (such as the word line signal during the period P2 as shown in FIGS. 3, 6, 9A-9B, 10A, and 11A) or a fourth voltage signal (such as the bit line and source line signals during the period P2 as shown in FIGS. 8A-8B, 9A-9B, 10B, and 11B), wherein the third voltage signal is configured to have a first voltage level (such as the voltage level V3 or V4) that is higher than a highest level (such as the voltage level V2) of the first voltage signal or lower than a lowest level (such as the voltage level V1) of the first voltage signal, and the fourth voltage signal is configured to have a second voltage level (such as the voltage level V3 or V4) that is higher than a highest level (such as the voltage level V2) of the second voltage signal or lower than a lowest level (such as the voltage level V1) of the second voltage signal.

In some embodiments, the method 1500 further includes, when every time period elapses, performing the recover operation. For example, as discussed in the embodiment corresponding to FIG. 14, when a time period of time t1-t5 elapses and the number of performed normal operations reaches the threshold value, the memory device 100 switches to perform the recover operation. In some embodiments, the time period corresponds to the time span that different numbers of normal operations have been performed, for example, 1000, 10000, or 100000 times or performed normal operations.

In some embodiments, the timer circuit 182 shown in FIG. 14 is configured to determine when time period elapses and enable the recover circuit (such as the recover circuits 180, 440, 540, 740, and 1220 shown in FIGS. 1, 4-5, 7, and 12) to perform the recover operation when every time period elapses.

In some embodiments, the method 1500 further includes detecting a current change associated with at least one of the data line or the source line, and, when the current change exceeds a threshold value, performing the recover operation. For example, as discussed in previous embodiments, the sense amplifier circuit 160 in FIG. 1 or the sense amplifier circuit 720 in FIG. 7 is configured to detect the change of the current passing through the bit line and the source line and when the current change exceeds the threshold value, the sense amplifier circuit is configured to enable the recover operation.

In some embodiments, the method 1500 further includes monitoring the current change while performing the recover operation, and when the current change is equal to or lower than the threshold value, performing the normal operation. For example, as discussed in previous embodiments, the sense amplifier circuit 160 in FIG. 1 or the sense amplifier circuit 720 in FIG. 7 is configured to monitor the current change of the bit line and the source line while the recover operation is being performed and when the current change is equal to or lower than the threshold value after a number of recover operations has been performed, the sense amplifier circuit is configured to enable the normal operation.

As described above, the present disclosure provides a memory device that includes a recover circuit configured to recover the memory cells subject to performance degradation. In such configuration, the memory cells can have extend life time and better performance.

In some embodiments, a memory device is provided, including a memory array, a driver circuit, and a recover circuit. The memory array includes multiple memory cells. Each one of the memory cells is coupled to a control line, a data line, and a source line and, during a normal operation, is configured to receive a first voltage signal through the control line and to receive a second voltage signal through at least one of the data line or the source line. The driver circuit is coupled to the memory cells and configured to output at least one of the first voltage signal or the second voltage signal to each one of the memory cells. The recover circuit is configured to output, during a recover operation, a third voltage signal, through the driver circuit to at least one of the memory cells. The third voltage signal is configured to have a first voltage level that is higher than a highest level of the first voltage signal or the second voltage signal, or lower than a lowest level of the first voltage signal or the second voltage signal.

In some embodiments, the driver circuit includes at least one of a header unit or a footer unit and a transmission unit. The header unit is configured to generate a first reference voltage signal. The footer unit that is configured to generate a second reference voltage signal. The transmission unit is coupled in series with the at least one of the header unit or the footer unit and coupled to a portion of the memory cells. The transmission unit is configured to transmit the first reference voltage signal or the second reference voltage signal as the first voltage signal, to the portion of the memory cells. The recover circuit includes at least one recover unit. The at least one recover unit is coupled in parallel with the header unit or the footer unit and configured to generate, as the third voltage signal, at least one operation voltage signal that is configured to have a voltage level higher than a voltage level of the first reference voltage signal or lower than a voltage level of the second reference voltage signal.

In some embodiments, the driver circuit includes at least one of a header unit or a footer unit and a sense amplifier unit. The header unit is configured to generate a first reference voltage signal. The footer unit is configured to generate a second reference voltage signal. The sense amplifier unit is coupled to the at least one of the header unit or the footer unit and is coupled to at least one portion of the memory cells. The sense amplifier unit is configured to output the first reference voltage signal or the second reference voltage signal as the second voltage signal, to the at least one portion of the memory cells. The recover circuit includes at least one recover unit. The at least one recover unit is coupled in parallel with the header unit or the footer unit and configured to generate, as the third voltage signal, at least one operation voltage signal that is configured to have a voltage level higher than a voltage level of the first reference voltage signal or lower than a voltage level of the second reference voltage signal.

In some embodiments, each one of the memory cells includes a transistor. The recover circuit is coupled to a bulk terminal of the transistor of each one of the memory cells, and is configured to transmit a positive bias voltage signal or a negative bias voltage signal to the bulk terminal of the transistor of each corresponding memory cell of the memory cells.

In some embodiments, the memory device further includes a timer circuit configured to enable, when every time period elapses, the recover circuit to perform the recover operation.

In some embodiments, the memory device further includes a detecting circuit configured to detect a current change associated with at least one of the data line or the source line, and when the current change exceeds a threshold value, configured to enable the recover circuit to perform the recover operation.

In some embodiments, the memory device further includes an enabling circuit configured to enable, periodically and when a current change associated with at least one of the data line or the source line exceeds a threshold value, the recover circuit to perform the recover operation.

In some embodiments, the third voltage signal is configured to be asserted to have the first voltage level for a number of times continuously, before the normal operation.

In some embodiments, the third voltage signal having the first voltage level is configured to have a pulse width that is greater than a pulse width of the at least one of the first voltage signal or the second voltage signal.

In some embodiments, a memory device is provided, including a memory array, a control line driver, a sense amplifier circuit, and a recover circuit. The memory array includes multiple memory cells. Each one of the memory cells is coupled to a control line, a data line, and a source line and, during a normal operation, is configured to receive a first voltage signal through the control line and to receive a second voltage signal through at least one of the data line or the source line. The control line driver is coupled to the memory cells and configured to output the first voltage signal. The sense amplifier circuit is coupled to the memory cells and configured to output the second voltage signal. The recover circuit is configured to output, during a recover operation, at least one of a third voltage signal or a fourth voltage signal to at least one of the memory cells. The third voltage signal is configured to have a first voltage level that is higher than a highest level of the first voltage signal or lower than a lowest level of the first voltage signal, and the fourth voltage signal is configured to have a second voltage level that is higher than a highest level of the second voltage signal or lower than a lowest level of the second voltage signal.

In some embodiments, the control line driver includes a header unit and a transmission unit. The header unit that is configured to generate a first reference voltage signal. The transmission unit is coupled in series with the header unit and coupled to a portion of the memory cells. The transmission unit is configured to transmit the first reference voltage signal as the first voltage signal, to the portion of the memory cells. The recover circuit includes multiple transistors. The transistors are coupled in parallel with the header unit and are configured to generate multiple operation voltage signals. The operation voltage signals have voltage levels that are different from each other and are all higher than a voltage level of the first reference voltage signal. During the recover operation, one of the transistors is configured to generate, as the third voltage signal, a corresponding one of the operation voltage signal in response to an enabling signal.

In some embodiments, the control line driver includes a footer unit and a transmission unit. The footer unit is configured to generate a first reference voltage signal. The transmission unit is coupled in series with the footer unit and coupled to a portion of the memory cells. The transmission unit is configured to transmit the first reference voltage signal as the first voltage signal, to the portion of the memory cells. The recover circuit includes multiple transistors. The transistors are coupled in parallel with the footer unit and are configured to generate multiple operation voltage signals. The operation voltage signals have voltage levels that are different from each other and are all lower than a voltage level of the first reference voltage signal. During the recover operation, one of the transistors is configured to generate, as the third voltage signal, a corresponding one of the plurality of operation voltage signal in response to an enabling signal.

In some embodiments, the sense amplifier circuit includes at least one of a header unit or a footer unit and a sense amplifier unit. The header unit is configured to generate a first reference voltage signal. The footer unit is configured to generate a second reference voltage signal. The sense amplifier unit is coupled to the at least one of the header unit or the footer unit and coupled to at least one portion of the memory cells. The sense amplifier unit is configured to output the first reference voltage signal or the second reference voltage signal as the second voltage signal, to the at least one portion of the memory cells. The recover circuit includes multiple transistors. The transistors are coupled in parallel with the at least one of the header unit or the footer unit and are configured to generate a plurality of operation voltage signals. The operation voltage signals have voltage levels that are different from each other and are all different from a voltage level of the first reference voltage signal and a voltage level of the second reference voltage signal. During the recover operation, one of the transistors is configured to generate, as the fourth voltage signal, a corresponding one of the plurality of operation voltage signal in response to an enabling signal.

In some embodiments, each one of the memory cells includes a transistor. The recover circuit is coupled to a bulk terminal of the transistor of each one of the memory cells, and is configured to transmit a positive bias voltage signal or a negative bias voltage signal to the bulk terminal of the transistor of each corresponding memory cell of the memory cells.

In some embodiments, the memory device further includes a timer circuit or a detecting circuit. The timer circuit is configured to enable, when every time period elapses, the recover circuit to perform the recover operation. The detecting circuit is configured to detect a current change associated with at least one of the data line or the source line, and when the current change exceeds a threshold value, configured to enable the recover circuit to perform the recover operation.

In some embodiments, the third voltage signal is configured to be asserted to have the first voltage level, or the fourth voltage signal is configured to be asserted to have the second voltage level, for a number of times continuously, before the normal operation; or the at least one of the third voltage signal having the first voltage level or the fourth voltage signal having the second voltage level is configured to have a pulse width that is greater than a pulse width of the at least one of the first voltage signal or the second voltage signal.

In some embodiments, a method is provided, including: during a normal operation, each one of multiple memory cells receiving a first voltage signal through a control line and receiving a second voltage signal through at least one of a data line or a source line; and during a recover operation, at least one of the memory cells receiving at least one of a third voltage signal or a fourth voltage signal. The third voltage signal is configured to have a first voltage level that is higher than a highest level of the first voltage signal or lower than a lowest level of the first voltage signal, and the fourth voltage signal is configured to have a second voltage level that is higher than a highest level of the second voltage signal or lower than a lowest level of the second voltage signal.

In some embodiments, the method further includes: when every time period elapses, performing the recover operation.

In some embodiments, the method further includes: detecting a current change associated with at least one of the data line or the source line; and when the current change exceeds a threshold value, performing the recover operation.

In some embodiments, the method further includes: monitoring the current change while performing the recover operation; and when the current change is equal to or lower than the threshold value, performing the normal operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array comprising a plurality of memory cells, wherein each one of the plurality of memory cells is coupled to a control line, a data line, and a source line and, during a normal operation, is configured to receive a first voltage signal through the control line and to receive a second voltage signal through at least one of the data line or the source line,
wherein the first voltage signal oscillates between a first voltage level and a second voltage level lower than the first voltage level;
a driver circuit coupled to the plurality of memory cells and configured to output at least one of the first voltage signal or the second voltage signal to each one of the plurality of memory cells, wherein the driver circuit comprises:
at least one of a header unit that is configured to generate a first reference voltage signal, or a footer unit that is configured to generate a second reference voltage signal; and
a transmission unit coupled in series with the at least one of the header unit or the footer unit and coupled to a portion of the plurality of memory cells, wherein the transmission unit is configured to transmit the first reference voltage signal or the second reference voltage signal as the first voltage signal, to the portion of the plurality of memory cells; and
a recover circuit configured to output, during a recover operation, a third voltage signal, through the driver circuit to at least one of the plurality of memory cells, wherein the third voltage signal is configured to have a highest voltage level higher than the first voltage level and a lowest voltage level equal to the second voltage level.

2. The memory device of claim 1, wherein
the recover circuit comprises:
at least one recover unit coupled in parallel with the header unit or the footer unit and configured to generate, as the third voltage signal, at least one operation voltage signal that is configured to have the highest voltage level higher than a voltage level of the first reference voltage signal.

3. The memory device of claim 1, wherein
the transmission unit comprises:
a sense amplifier unit coupled to the at least one of the header unit or the footer unit and coupled to at least one portion of the plurality of memory cells, wherein the sense amplifier unit is configured to output the first reference voltage signal or the second reference voltage signal as the second voltage signal, to the at least one portion of the plurality of memory cells;
wherein the recover circuit comprises:
at least one recover unit coupled in parallel with the header unit or the footer unit and configured to generate, as the third voltage signal, at least one operation voltage signal that is configured to have the highest voltage level higher than a voltage level of the first reference voltage signal.

4. The memory device of claim 1, wherein
each one of the plurality of memory cells comprises a transistor, and
the recover circuit is coupled to a bulk terminal of the transistor of each one of the plurality of memory cells, and is configured to transmit a positive bias voltage signal or a negative bias voltage signal to the bulk terminal of the transistor of each corresponding memory cell of the plurality of memory cells.

5. The memory device of claim 1, further comprising:
a timer circuit configured to enable, when every time period elapses, the recover circuit to perform the recover operation.

6. The memory device of claim 1, further comprising:
a detecting circuit configured to detect a current change associated with at least one of the data line or the source line, and when the current change exceeds a threshold value, configured to enable the recover circuit to perform the recover operation.

7. The memory device of claim 1, further comprising:
an enabling circuit configured to enable, periodically and when a current change associated with at least one of the data line or the source line exceeds a threshold value, the recover circuit to perform the recover operation.

8. The memory device of claim 1, wherein the third voltage signal is configured to be asserted to have the highest voltage level for a number of times continuously, before the normal operation.

9. The memory device of claim 1, wherein the third voltage signal having the highest voltage level is configured to have a pulse width that is greater than a pulse width of the at least one of the first voltage signal or the second voltage signal.

10. A memory device, comprising:
a memory array comprising a plurality of memory cells, wherein each one of the plurality of memory cells is coupled to a control line, a data line, and a source line and, during a normal operation, is configured to receive a first voltage signal through the control line and to receive a second voltage signal through at least one of the data line or the source line,
wherein the first voltage signal oscillates between a positive voltage level and a negative voltage level;
a control line driver coupled to the plurality of memory cells and configured to output the first voltage signal, wherein the control line driver comprises:
at least one of a header unit that is configured to generate a first reference voltage signal, or a footer unit that is configured to generate a second reference voltage signal; and
a transmission unit coupled in series with the at least one of the header unit or the footer unit and coupled to a portion of the plurality of memory cells, wherein the transmission unit is configured to transmit the first reference voltage signal or the second reference voltage signal as the first voltage signal, to the portion of the plurality of memory cells;
a recover circuit configured to output, during a recover operation, at least one of a third voltage signal or a fourth voltage signal to at least one of the plurality of memory cells, wherein the third voltage signal is configured to have a first voltage level that is lower than the negative voltage level, and the fourth voltage signal is configured to have a second voltage level that is higher than a highest level of the second voltage signal or lower than a lowest level of the second voltage signal.

11. The memory device of claim 10, wherein the recover circuit comprises:
a plurality of transistors coupled in parallel with the header unit and configured to generate a plurality of operation voltage signals, wherein the plurality of operation voltage signals have voltage levels that are different from each other and are all higher than a voltage level of the first reference voltage signal;
wherein, during the recover operation, one of the plurality of transistors is configured to generate, as the third voltage signal, a corresponding one of the plurality of operation voltage signal in response to an enabling signal.

12. The memory device of claim 10, wherein the recover circuit comprises:
a plurality of transistors coupled in parallel with the footer unit and configured to generate a plurality of operation voltage signals, wherein the plurality of operation voltage signals have voltage levels that are different from each other and are all lower than a voltage level of the first reference voltage signal;
wherein, during the recover operation, one of the plurality of transistors is configured to generate, as the third voltage signal, a corresponding one of the plurality of operation voltage signal in response to an enabling signal.

13. The memory device of claim 10, wherein the transmission unit comprises:
a sense amplifier unit coupled to the at least one of the header unit or the footer unit and coupled to at least one portion of the plurality of memory cells, wherein the sense amplifier unit is configured to output the first reference voltage signal or the second reference voltage signal as the second voltage signal, to the at least one portion of the plurality of memory cells;
wherein the recover circuit comprises:
a plurality of transistors coupled in parallel with the at least one of the header unit or the footer unit and configured to generate a plurality of operation voltage signals, wherein the plurality of operation voltage signals have voltage levels that are different from each other and are all different from a voltage level of the first reference voltage signal and a voltage level of the second reference voltage signal;
wherein, during the recover operation, one of the plurality of transistors is configured to generate, as the fourth voltage signal, a corresponding one of the plurality of operation voltage signal in response to an enabling signal.

14. The memory device of claim 10, wherein each one of the plurality of memory cells comprises a transistor, and
the recover circuit is coupled to a bulk terminal of the transistor of each one of the plurality of memory cells, and is configured to transmit a positive bias voltage signal or a negative bias voltage signal to the bulk terminal of the transistor of each corresponding memory cell of the plurality of memory cells.

15. The memory device of claim 10, further comprising:
a timer circuit configured to enable, when every time period elapses, the recover circuit to perform the recover operation; or
a detecting circuit configured to detect a current change associated with at least one of the data line or the source line, and when the current change exceeds a threshold value, configured to enable the recover circuit to perform the recover operation.

16. The memory device of claim 10, wherein the third voltage signal is configured to be asserted to have the first voltage level, or the fourth voltage signal is configured to be asserted to have the second voltage level, for a number of times continuously, before the normal operation; or
wherein the at least one of the third voltage signal having the first voltage level or the fourth voltage signal having the second voltage level is configured to have a pulse width that is greater than a pulse width of the at least one of the first voltage signal or the second voltage signal.

17. A method, comprising:
during a normal operation, each one of a plurality of memory cells receiving a first voltage signal through a control line and receiving a second voltage signal through at least one of a data line or a source line;
generating a first reference voltage signal by a header unit or generating a second reference voltage signal by a footer unit;
transmiting the first reference voltage signal or the second reference voltage signal as the first voltage signal to the plurality of memory cells by a transmission unit coupled in series with the at least one of the header unit or the footer unit; and during a recover operation, at least one of the plurality of memory cells receiving at least one of a third voltage signal or a fourth voltage signal, wherein the third voltage signal oscillates between a positive voltage level and a negative voltage level, wherein a magnitude of the positive voltage level is different from a magnitude of the negative voltage level, wherein the positive voltage level is higher than a highest level of the first voltage signal or the negative voltage level is lower than a lowest level of the first voltage signal, wherein the fourth voltage signal is configured to have a second voltage level that is higher than a highest level of the second voltage signal or lower than a lowest level of the second voltage signal.

18. The method of claim 17, further comprising:
when every time period elapses, performing the recover operation.

19. The method of claim 17, further comprising:
detecting a current change associated with at least one of the data line or the source line; and
when the current change exceeds a threshold value, performing the recover operation.

20. The method of claim 19, further comprising:
monitoring the current change while performing the recover operation; and
when the current change is equal to or lower than the threshold value, performing the normal operation.

* * * * *